US008649473B2

(12) United States Patent
Nishi et al.

(10) Patent No.: US 8,649,473 B2
(45) Date of Patent: Feb. 11, 2014

(54) METHOD AND APPARATUS FOR RECEIVING BURST DATA WITHOUT USING EXTERNAL DETECTION SIGNAL

(75) Inventors: Yoshinori Nishi, Chiba (JP); Masahiro Konishi, Chiba (JP)

(73) Assignee: MegaChips Corporation, Osaka-shi (JP)

( * ) Notice: Subject to any disclaimer, the term of this patent is extended or adjusted under 35 U.S.C. 154(b) by 738 days.

(21) Appl. No.: 12/801,835

(22) Filed: Jun. 28, 2010

(65) Prior Publication Data
US 2011/0001531 A1  Jan. 6, 2011

Related U.S. Application Data

(63) Continuation-in-part of application No. 12/496,159, filed on Jul. 1, 2009, now abandoned.

(51) Int. Cl.
*H04L 7/00* (2006.01)
(52) U.S. Cl.
USPC ............................................. 375/354
(58) Field of Classification Search
USPC ......... 375/221, 233, 340, 350, 354, 355, 359, 375/371, 373, 376; 398/9, 26, 38, 58, 72, 398/97, 98, 155
See application file for complete search history.

(56) References Cited

U.S. PATENT DOCUMENTS 7,519,750 B2    4/2009  Scouten et al.
7,555,087 B1 *  6/2009  Asaduzzaman et al. ...... 375/359
2007/0041485 A1    2/2007  Chang
2007/0224958 A1 *  9/2007  Nedachi ...................... 455/226.1
2008/0022143 A1 *  1/2008  Scouten et al. ............... 713/400
2009/0052894 A1    2/2009  Murata
2009/0080890 A1 *  3/2009  Miura et al. .................... 398/72
2009/0122939 A1 *  5/2009  Hoang et al. .................. 375/375
2009/0279886 A1 * 11/2009  Suvakovic ..................... 398/26

FOREIGN PATENT DOCUMENTS

JP    2007-20008    1/2007
JP    2010-57006    3/2010

OTHER PUBLICATIONS

Apr. 26, 2012 Office Action issued in related U.S. Appl. No. 12/496,159.

* cited by examiner

*Primary Examiner* — Sam K Ahn
*Assistant Examiner* — Syed Haider
(74) *Attorney, Agent, or Firm* — Oblon, Spivak, McClelland, Maier & Neustadt, L.L.P.

(57) ABSTRACT

Apparatus and method for receiving burst data signal without using external detection signal are disclosed. The apparatus can include a clock data recovery (CDR) circuit to generate a clock signal, and a detection circuit to detect an initial portion in the data recovered from the input signal. The CDR circuit can have a first mode that attempts to synchronize the clock signal with a reference data signal, and a second mode that attempts to synchronize the clock signal with the burst data signal and to recover data based on the clock signal. The apparatus can include a controller to conduct a process including, in sequence, setting the CDR circuit in the first mode, setting the CDR circuit in the second mode, and keeping the CDR circuit in the second mode when the detection circuit detects the initial portion in the recovered data.

7 Claims, 11 Drawing Sheets

METHOD AND APPARATUS FOR RECEIVING BURST DATA WITHOUT USING EXTERNAL DETECTION SIGNAL

CROSS REFERENCE TO RELATED APPLICATION

This application is a Continuation-in-Part of U.S. application Ser. No. 12/496,159 filed Jul. 1, 2009. The disclosure of prior application is incorporated by reference herein in its entirety.

BACKGROUND

A high-speed network may use burst data communication. For example, a passive optical network (PON) may use burst data communication to register optical network unit (ONU) apparatuses with an optic line terminal (OLT) apparatus. In the PON, the OLT apparatus can be configured as a station apparatus and the ONU apparatuses can be configured as subscriber apparatuses. The OLT apparatuses may need to receive burst data communications from the OLT apparatus.

U.S. Pat. No. 7,519,750 describes a burst clock data recovery circuit for receiving burst data communications, and US Patent Publication No. 2009-052894 describes a discovery process of an unregistered ONU, both of which are hereby incorporated by references in their entireties.

SUMMARY

Aspects of this disclosure can provide methods and apparatuses for burst data communication without using an external detection signal.

An aspect of this disclosure can provide an apparatus for receiving a burst data signal having data edges and corresponding to burst data including an initial portion. The apparatus can include an input circuit configured to receive an electrical signal and output an input signal, a reference data signal generator configured to generate a reference data signal having reference edges, and a clock data recovery (CDR) circuit configured to generate a clock signal having clock edges. The CDR circuit can have a first mode that attempts to synchronize the clock edges with the reference edges, and a second mode that attempts to synchronize the clock edges with the data edges and to recover data from the input signal based on the clock signal. In addition, the apparatus can include a detection circuit configured to detect the initial portion in the data recovered from the input signal, and a controller configured to conduct a process including following steps in sequence: setting the CDR circuit in the first mode to synchronize the clock edges with the reference edges, setting the CDR circuit in the second mode while supplying the data recovered from the input signal to the detection circuit, and keeping the CDR circuit in the second mode when the detection circuit detects the initial portion in the data. The controller can be further configured to initiate a next cycle of the process when the detection circuit does not detect the initial portion in the data within a predetermined time period.

In an embodiment, the reference data signal generator can be configured to generate the reference data signal such that a first frequency of the clock signal whose clock edges are synchronized with the reference edges is substantially the same as a second frequency of the clock signal whose clock edges are synchronized with the data edges. In another embodiment, the burst data can be data from an optical network unit (ONU) to an optical line terminal (OLT), the OLT includes a transmitter that generates an output data signal to be transmitted to the ONU based on a transmitter clock signal, and the reference data signal generator generates the reference data signal based on the transmitter clock signal.

According to an aspect of this disclosure, the apparatus can further include means for detecting an end of the burst data, and the controller can be configured to initiate, after the keeping, a next cycle of the process when the means for detecting detects the end of the burst data.

In an embodiment, the initial portion can include a predetermined bit pattern, and the detection circuit can include a pattern matching circuit configured to detect the predetermined bit pattern in the data recovered from the input signal.

Additionally, the CDR circuit can include a selector configured to select one of the reference data signal and the input signal, and a phase comparator configured to compare a phase of the clock signal and a phase of the selected signal. The controller can be configured to control the selector to select the reference data signal in the first mode and to select the input signal in the second mode.

Aspect of this disclosure can provide an apparatus for receiving burst data signal having data edges and corresponding to burst data from an optical network unit (ONU) including an initial portion. The apparatus can include a transmitter configured to generate an output data signal to be transmitted to the ONU based on a transmitter clock signal, a reference data signal generator configured to generate a reference data signal having reference edges based on the transmitter clock signal, and a clock data recovery (CDR) circuit configured to generate a clock signal. In addition, the apparatus can include a detection circuit configured to detect the initial portion in the data recovered from the input signal, and a controller configured to conduct a process including following steps in sequence: setting the CDR circuit in a first mode to synchronize the clock edges with the reference edges, setting the CDR circuit in a second mode while supplying the data recovered from the input signal to the detection circuit, and keeping the CDR circuit in the second mode when the detection circuit detects the initial portion in the data. The controller can be further configured to initiate a next cycle of the process when the detection circuit does not detect the initial portion in the data within a predetermined time period.

Aspects of this disclosure can provide a method for receiving a burst data signal having data edges and corresponding to burst data including an initial portion. The method can include receiving an input signal, generating a reference data signal having reference edges, and generating a clock signal having clock edges by using a clock data recovery (CDR) circuit. The method can further include conducting a process including following steps in sequence: setting the CDR circuit in a first mode to synchronize the clock edges with the reference edges, setting the CDR circuit in a second mode while trying to detect the initial portion in the data recovered from the input data, and keeping the CDR circuit in the second mode when the initial portion is detected. The conducting can further includes initiating a next cycle of the process when the initial portion is not detected in the data within a predetermined time period.

Further, aspects of this disclosure can provide a method for receiving burst data signal having data edges and corresponding to burst data from an optical network unit (ONU) including an initial portion. The method can include generating an output data signal to be transmitted to the ONU based on a transmitter clock signal, generating a reference data signal having reference edges based on the transmitter clock signal, and generating a clock signal having clock edges by using a clock data recovery (CDR) circuit. The method can further include conducting a process including following steps in sequence: setting the CDR circuit in a first mode to synchronize the clock edges with the reference edges, setting the CDR circuit in a second mode while trying to detect the initial portion in the data recovered from the input signal, and keeping the CDR circuit in the second mode when the initial portion is detected in the data. The conducting further includes initiating a next cycle of the process when the initial portion is not detected in the data within a predetermined time period.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Figure 1:
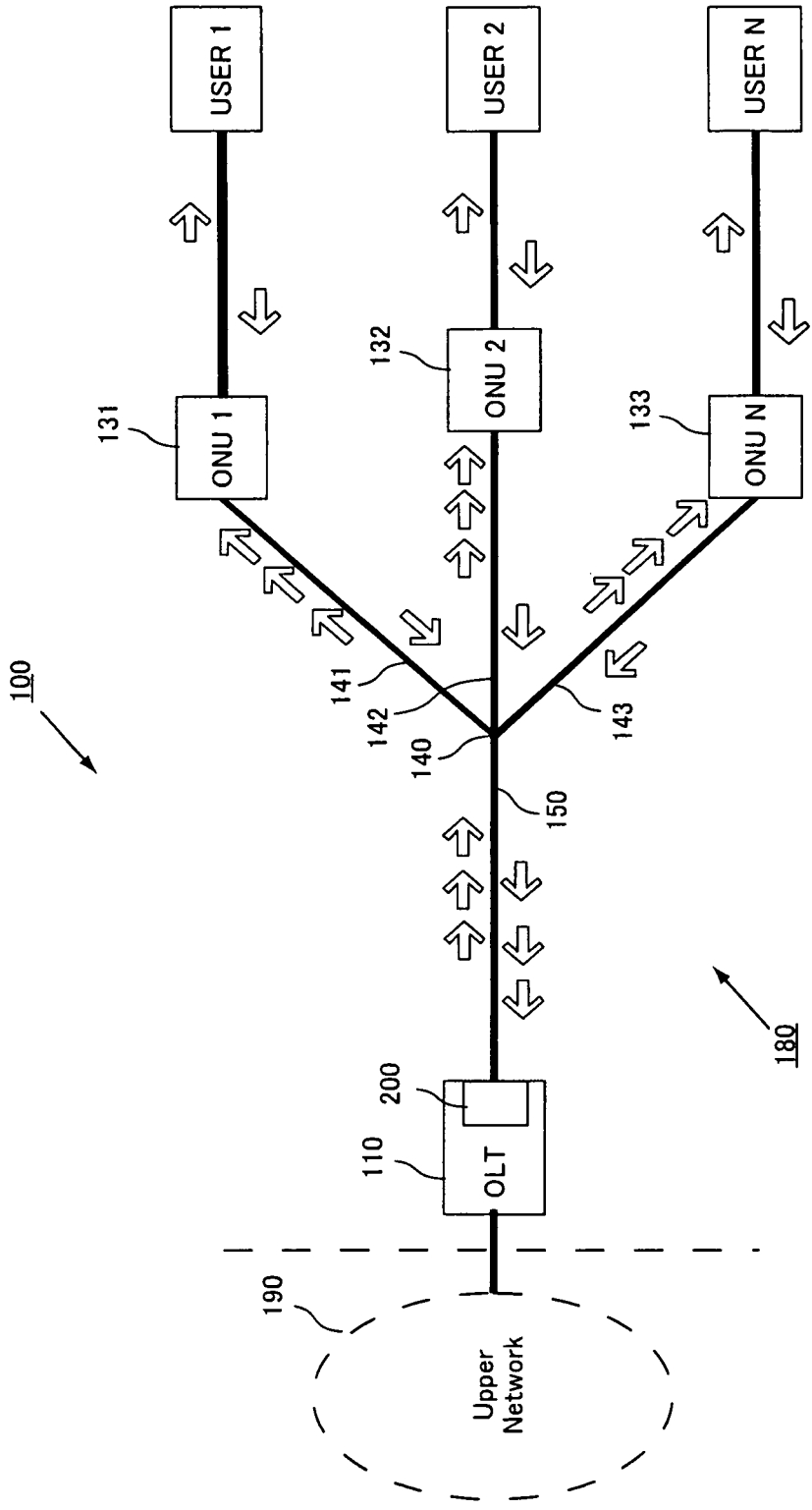
FIG. 1 shows a block diagram of an exemplary network according to an embodiment of this disclosure.

FIG. 1 shows a block diagram of an exemplary network according to an embodiment of this disclosure. The network 100 can include an upper network 190 and a sub-network 180. The sub-network 180 can be configured in a station-subscriber manner, such as passive optical network (PON), Ethernet passive optical network (EPON), and the like. In the FIG. 1 example, the sub-network 180 can include an optic line terminal (OLT) apparatus 110 configured as a station apparatus, and a plurality of optical network unit (ONU) apparatuses 131-133 configured as subscriber apparatuses. These elements can be coupled together as shown in FIG. 1.

The OLT apparatus 110 can provide a communication entrance for the plurality of ONU apparatuses 131-133 to communicate with other part of the network, such as the upper network 190. In an embodiment, the plurality of optical fibers 141-143 can respectively couple the plurality of ONU apparatuses 131-133 to the OLT apparatus 110 through an optical splitter 140 and an optical fiber 150.

The plurality of ONU apparatuses 131-133 can be respectively installed at subscriber sites, and can be configured as gateways for the subscribers to access the network. The ONU apparatuses 131-133 can couple various user devices, such as routers, computers, telephones, televisions, and the like, to the network.

Generally, burst data communication can be used in the station-subscriber type of network for upstream communications. According to an embodiment of this disclosure, the OLT apparatus 110 can include a transceiver 200, which can be configured to receive burst data.

In the FIG. 1 example, an ONU apparatus, for example, the ONU apparatus 131, may need to register with the OLT apparatus 110 using burst data in order to enable network communications via the OLT apparatus 110. More specifically, when the ONU apparatus 131 registers with the OLT apparatus 110, the ONU apparatus 131 can obtain a key for downstream transmissions from the OLT apparatus 110, and a time slot for upstream transmissions to the OLT apparatus 110. The key and the time slot can enable the ONU apparatus 131 to communicate with the rest of the network via the OLT apparatus 110.

More specifically, when the OLT apparatus 110 broadcasts downstream transmissions to the plurality of ONU apparatuses 131-133, the ONU apparatus 131 may obtain transmissions directed to it based on the key. On the other hand, when the ONU apparatus 131 transmits upstream communications, the ONU apparatus 131 may use the obtained time slot that can be non-overlapping with time slots of the other ONU apparatuses.

The OLT apparatus 110 can be configured to register ONU apparatuses in a discovery time window. For example, the OLT apparatus 110 may broadcast a message that informs a time slot of a next discovery time window. The message can be received by an ONU apparatus, for example, the ONU apparatus 131, that can be powered-up, however, has not registered with the OLT apparatus 110. The ONU apparatus 131 may wait for the discovery time window, and transmit a registration request message in the upstream channel within the discovery time window.

On the other hand, the OLT apparatus 110 can be configured to listen to the upstream channel for registration request messages in the discovery time window. According to an embodiment of this disclosure, the transceiver 200 can phase-lock a clock signal to the registration request messages in a reduced time in order to recover data in the registration request messages. Further, the transceiver can be configured to detect registration request message, so that the transceiver 200 can receive the registration request message without using an external detection signal.

After the OLT apparatus 110 discovers the registration request message, the OLT apparatus 110 may send a registration message to the ONU apparatus 131 to inform a key for downstream communication and a time slot for upstream communication. In addition, the OLT apparatus may transmit a grant message to the ONU apparatus 131. When the ONU apparatus 131 receives the grant message, the ONU apparatus 131 can transmit a registration acknowledgement message to the OLT apparatus 110, and start network communication.

Generally, the registration request message and other messages from the ONU apparatus can be transmitted as burst data in a binary stream. The binary stream may include a preamble portion, a delimiter portion, a payload portion, and an end of burst portion. The preamble portion can include a number of binary bits that can result in a receiver to phase-lock to the burst data. The delimiter can include a predetermined pattern to indicate a start boundary of the payload portion. The payload portion can include communication content for the burst data, such as information for registration, and the like. The end of burst portion can include a predetermined pattern to indicate an end of the burst data. The transceiver 200 can detect and recover the burst data without using an external detection signal.

Figure 2:
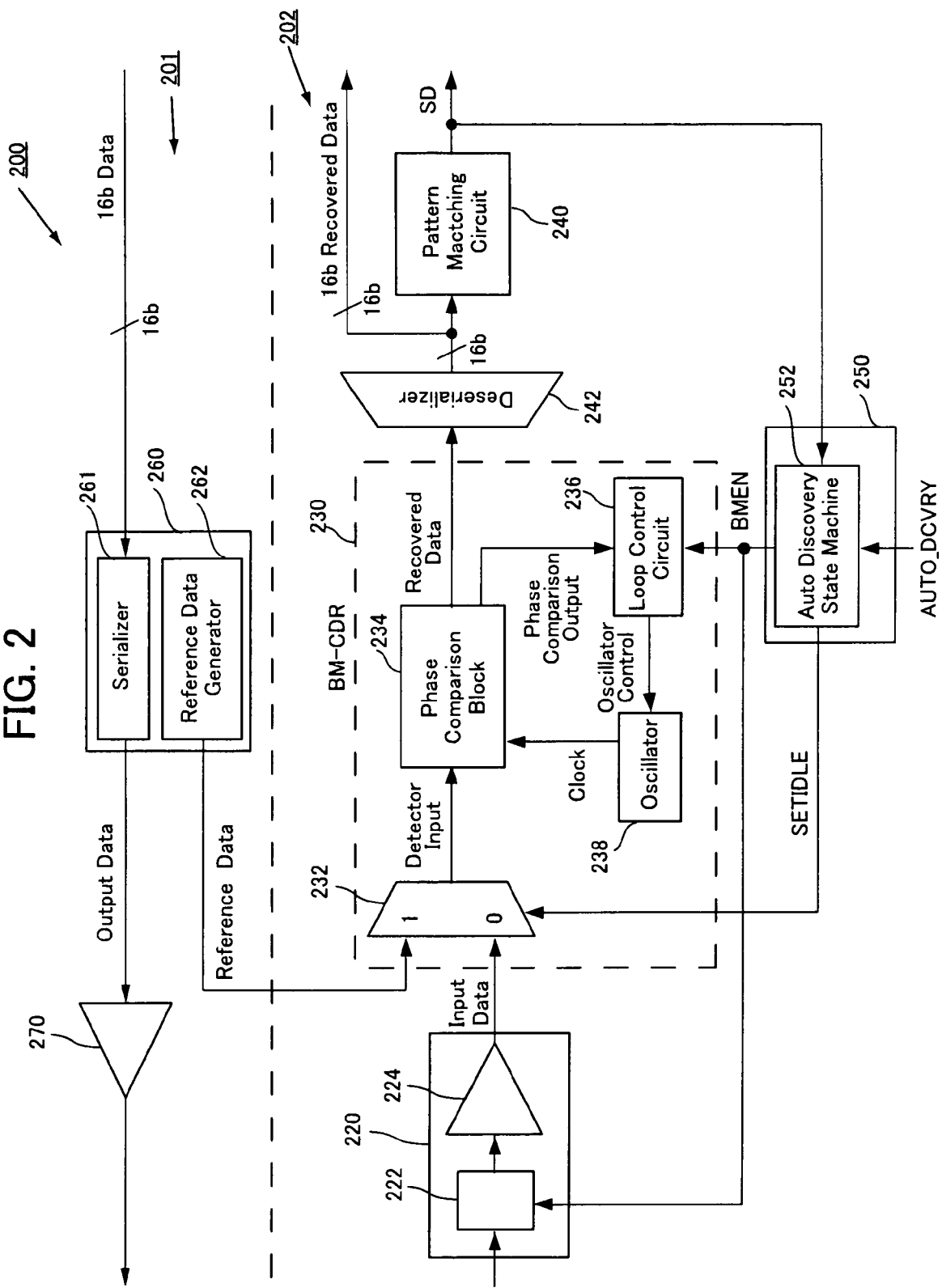
FIG. 2 shows a block diagram of an exemplary transceiver according to an embodiment of this disclosure.

FIG. 2 shows a block diagram of an exemplary transceiver 200 that includes a transmitter 201 and a burst data receiver 202 according to an embodiment of this disclosure. The transmitter 201 can include a transmitter module 260 and an output buffer module 270 coupled together. The transmitter module 260 can include a serializer 261 and a reference data generator 262. The burst data receiver 202 can include a front-end module 220, a burst mode clock data recovery (BM-CDR) 230, a deserializer 242, a pattern matching circuit 240, and a controller 250. These elements can be coupled together as shown in FIG. 2.

The front-end module 220 can receive an electrical signal, for example, from an optoelectric device, which can convert an optical signal to an electrical signal, and provide the electrical signal as input data signal to the BM-CDR 230. The front-end module 220 can include a decoupling capacitor unit 222 and an input buffer unit 224.

The BM-CDR 230 can receive the input data signal, and can recover the burst data from the input data signal when the input data signal corresponds to the burst data. More specifically, the BM-CDR 230 can lock a clock signal to the input data signal, and recover the burst data in the input data signal based on the clock signal.

Conventionally, a transceiver may be supplied with an external detection signal, which indicates that the burst data is received, and enable the BM-CDR to operate when the detection signal is supplied. For example, the optoelectric device may generate the detection signal when it detects an optical signal. The reliability of the external detection signal may be low because, for example, the optoelectric device may generate the detection signal when it receives a noise. The transceiver of this disclosure does not use an external detection signal and can reliably receive the burst data without being affected by the low reliability of the external detection signal.

In an example, the BM-CDR 230 can further include a selector 232, and a phase locked loop. The phase locked loop can further include a phase comparison block 234, a loop control circuit 236, and an oscillator 238 connected together to form a loop.

The selector 232 can receive a select signal SETIDLE from the controller 250. In addition, the selector 232 can receive the input data signal and a reference data signal, and can select one of the two signals as a detector input signal based on the select signal SETIDLE. Further, the selector 232 can provide the detector input signal to the phase locked loop. Then, the phase-looked loop can lock the clock signal to the detector input signal. According to this disclosure, the reference data signal can be utilized to reduce the time for phase-locking the clock signal to the input data signal.

In an example, the reference data generator 262 can generate the reference data signal based on a transmitter clock signal that the transmitter module 260 uses for downstream transmissions, i.e., uses to generate output data signal to be transmitted to the ONU apparatus 113. For example, the transmitter clock signal can have a frequency of 10.3125 GHz.

However, it is not necessary that the reference data generator 262 is included in the transmitter module 260 and that the reference data generator generates the reference data signal based directly on the transmitter clock signal. For example, the reference data generator 262 may generate the reference data signal based on a different clock signal that is generated based on a common reference signal, which is commonly used to generate the transmitter clock signal. In this case, the reference data signal is generated based indirectly on the transmitter clock signal.

The phase comparison block 234, the loop control circuit 236 and the oscillator 238 can form the phase locked loop to lock a clock signal to the detector input signal. The phase comparison block 234 can compare a phase of the detector input signal and a phase of the clock signal, and generate a phase comparison output. The phase comparison output can be received by the loop control circuit 236. The loop control circuit 236 can then generate an oscillator control signal based on the phase comparison output. Further, the oscillation control signal can adjust an oscillation frequency of the oscillator 238.

It is noted that the phase locked loop can be implemented by various technologies, such as analog phase comparison, digital phase comparison, current controlled oscillator, voltage controlled oscillator, analog filter type loop control circuit, digital filter type loop control circuit, and the like. Additionally, the phase locked loop can be suitably configured to reduce the time duration for locking to the burst data signal and to increase locking stability based on a control signal BMEN from the controller 250.

More specifically, the phase locked loop can include tunable operation parameters, such as loop gains, filter gains, and the like, that can be tuned based on the control signal BMEN. For example, the control signal BMEN can be configured to increase loop gains when the input data signal corresponds to the preamble portion of the burst data, such that the clock signal can be phase-locked to the input data signal with a reduced locking time. On the other hand, the control signal BMEN can be configured to reduce the loop gains when the input data signal corresponds to the payload portion of the burst data, such that the phase locked loop can have an increased locking stability.

The phase comparison block 234 can also include component circuit to recover data from the input signal based on the clock signal. The recovered data can be provided to the deserializer 242.

The deserializer 242 can convert the recovered data, which can be serial data, to parallel data, for example, 16-bit parallel data. The pattern matching circuit 240 can compare the recovered parallel data to a predetermined pattern. According to an embodiment of this disclosure, the pattern matching circuit 240 can provide a SD signal to the controller 250 based on the comparison. For example, the pattern matching circuit 240 can compare the recovered data to a predetermined pattern for the preamble portion, and generate the detection signal SD based on the comparison.

The parallel data and the SD signal are output to another circuit block (not shown) in the OLT device. Although not shown in FIG. 2, a clock signal recovered by the BM-CDR 230 is also output to another circuit block.

The controller 250 can receive the detection signal SD, and can provide various control signals to various modules of the burst data receiver 202. For example, the controller 250 may provide the BMEN signal to the front-end module 220 and the BM-CDR 230 to control their operations. In addition, the controller 250 can provide the selection signal SETIDLE to the BM-CDR 230 to configure the selector 232 to suitably select the detector input signal for phase locking.

It is noted that the controller 250 can be implemented by various techniques, such as a processor executing control software, hardware implemented state machine, and the like.

Figure 3:
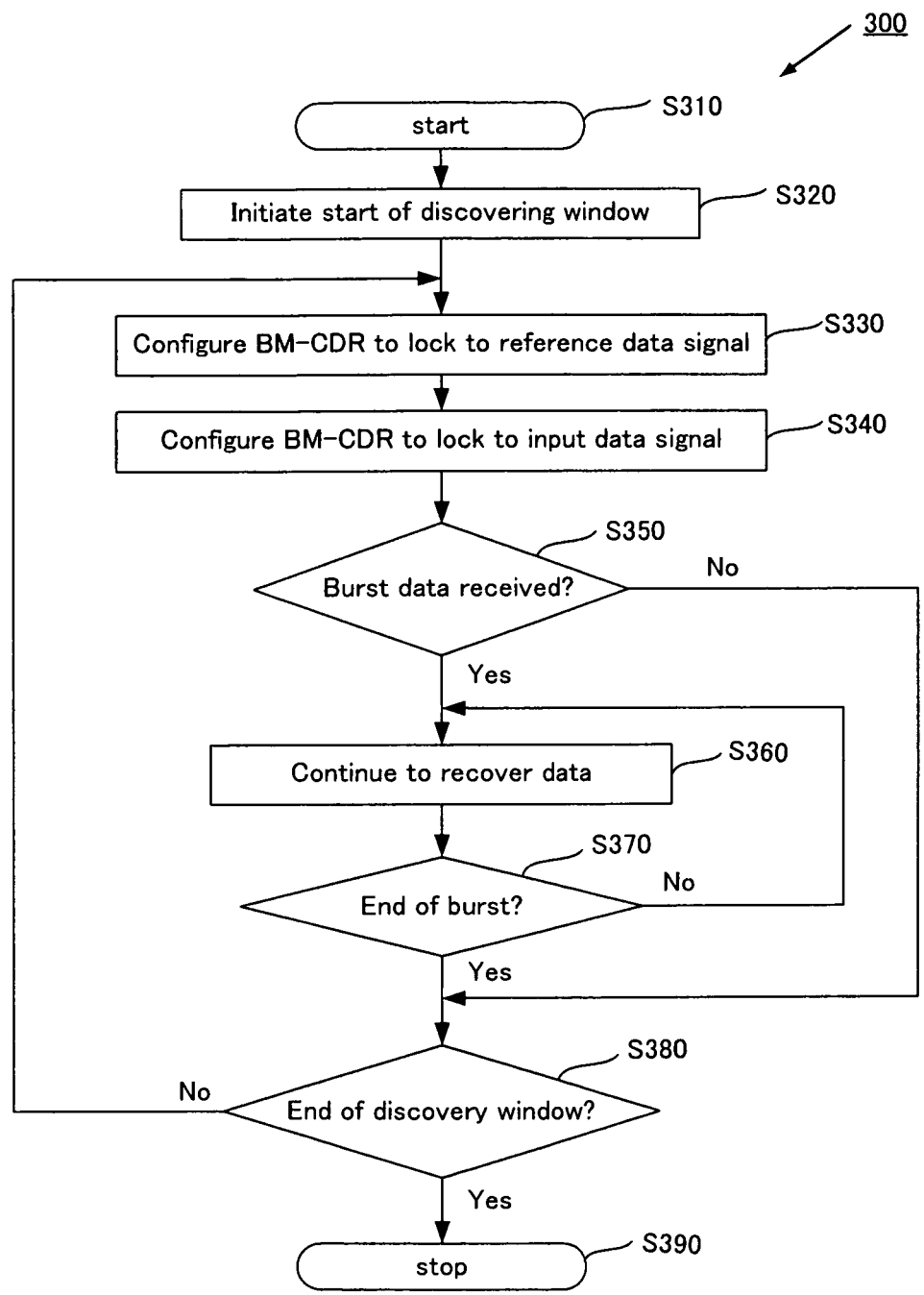
FIG. 3 shows a flow chart outlining an exemplary discovery process according to an embodiment of this disclosure.

FIG. 3 shows a flow chart outlining an exemplary burst data recovery process according to an embodiment of this disclosure. The burst data recovery process 300 can correspond to a discovery process of the OLT apparatus 110, to listen to the upstream channel in the discovery window for registration request messages from unregistered ONUs. The process starts at step S310 and proceeds to step S320.

In step S320, a media access control (MAC) layer (not show on FIG. 1) of the OLT apparatus 110 can initiate a start of the discovery window. For example, the OLT apparatus 110 may broadcast a discovery gate message to indicate a timing of a next discovery window. When the discovery gate message is received by a powered-up ONU apparatus, such as ONU apparatus 131, that has not registered with the OLT apparatus 110, the ONU 131 may transmit a registration request message according to the timing of the next discovery window to register with the OLT apparatus 110. The process then proceeds to step S330.

In step S330, the transceiver 200 of the OLT apparatus 110 can configure a burst mode clock data recovery (BM-CDR) module, such as the BM-CDR 230, to phase-lock a clock signal to a reference data signal. For example, the controller 250 may change the control signal SETIDLE to "1" to select the reference data signal to provide to the phase locked loop. The reference data signal may have a frequency that is related to a frequency of a clock signal used for transmitting down stream transmissions.

In an example, the frequency of the reference data signal can be ¼ of a clock frequency (a transmitter clock frequency) of the transmitter module 260, and may have a constant duty ratio of 50%. The BM-CDR 230 can be designed to generate the clock signal having a frequency about the transmitter clock frequency. Thus, when the BM_CDR 230 phase-locks the clock signal to the reference data signal, the clock signal can have substantially the same frequency as the transmitter clock frequency. The process then proceeds to step S340.

In step S340, the transceiver 200 may configure the BM-CDR 230 to phase-lock the clock signal to the input data signal provided by the front-end module. In an example, the controller 250 may change the SETIDLE to "0" to select the input data. In addition, the transceiver 200 can configure BM-CDR 230 to phase-lock the clock signal to the input data signal with a reduced locking time. In an example, the controller 250 may provide the control signal BMEN to adjust the loop gains of the phase locked loop. In another example, the controller 250 may provide the control signal BMEN to adjust a charging time of the front-end module to quickly settle the front-end module.

Generally, the ONU can recover its operation cloak signal (ONU clock signal) from the downstream transmissions. Accordingly, the ONU clock signal can have a frequency substantially the same as the frequency of the transmitter clock frequency, for example, with ±100 ppm difference according to a standard, such as IEEE 802.3av. The ONU can transmit the burst data based on the ONU clock signal.

Thus, when the input data signal corresponds to the burst data from the ONU, the frequency of the clock signal phase-locked to the input data signal can be substantially the same as the transmitter clock frequency. Accordingly, the frequency of the clock signal phase-locked to the reference data signal in step S330 and the frequency of the clock signal phase-locked to the input data signal in step 340 can be substantially the same with each other.

When the process proceeds from step S330 to step S340, the BM-CDR 230 changes the phase of the clock signal in order to phase-lock to the input data signal. However, it is not necessary to substantially change the frequency of the clock signal, because the frequency of the clock signal phase-locked to the input data signal is substantially the same as the frequency of the clock signal in step S330. As a result, when proceeds to step S340, the BM-CDR 230 can phase-lock the clock signal to the input data signal within a substantially shorter locking time compared to a case that step S330 is skipped.

When the clock signal is phase-locked to the input data signal, the transceiver 200 may recover data from the input data signal based on the clock signal. In an example, the transceiver 200 may recover serial data from the input data signal and convert the serial data to parallel data. Then, the process proceeds to step S350.

In step S350, the transceiver 200 can try to detect the preamble portion in the data recovered from the input data signal. If the preamble portion is detected, it is determined that the burst data is received. For example, the transceiver 200 shown in FIG. 2 includes a pattern matching circuit 240 that can compare the recovered data to a predetermined pattern, such as the predetermined pattern for the preamble portion of the burst data. When the preamble portion is detected, the process proceeds to step S360. Otherwise, the process proceeds to step S380.

The flow chart of FIG. 3 shows step S340 and S350 as separate steps. However, the pattern matching circuit requires the data recovered by the BM-CDR to detect the preamble pattern. Accordingly, at least some portions of steps S340 and S350 are performed simultaneously. That is, the transceiver 200 recovers data from the input data signal while trying to detect the preamble portion.

In step S360, the transceiver 200 can continue to recover data from the input data signal. Then, the process proceeds to step S370.

In step S370, the transceiver 200 may try to detect the end of the burst data. For example, the pattern matching circuit 240 shown in FIG. 2 may be configured to detect the end of the burst data by comparing the recovered data to a predetermined end pattern for the end of burst portion of the burst data. When the end of the burst data is detected, the process proceeds to step S380; otherwise, the process proceeds to step S360 to continue to recover data from the input data signal.

In step S380, the transceiver 200 may determine whether the discovery window expires. When the discovery window expires, the process proceeds to step S390, and terminates the process, otherwise, the process returns to step S330 to initiate another cycle of the process including steps S330, S340 and S350.

Although the transceiver 200 shown in FIG. 2 includes the pattern matching circuit 240 for detecting the preamble portion of the burst data, it is possible to use various other types of circuits to detect the preamble portion.

For example, if the preamble portion has a periodic bit pattern, it is possible to detect the preamble portion by counting a number of rising or falling edges in the recovered data within a predetermined time period. It is also possible to detect the preamble portion by observing internal signals such as the phase comparison output signal or the oscillator control signal of the BM-CDR 230. That is, when the burst data is not received, the BM-CDR 230 cannot stably generate the clock signal and the internal signals fluctuate. When the preamble portion of the burst data is received, the BM-CDR 230 can stably generate the clock signal phase-locked to the burst data, and the internal signals do not fluctuate.

Similarly, various types of circuits other than the pattern matching circuit that detects the end of burst portion may be used to detect the end of burst data. Specifically, it is not necessary to detect the end of burst portion of the burst data, but it is also possible to detect the period after the end of burst portion to determine the end of the burst data. For example, end of the burst data can be detected when a predetermined number of consecutive "0"s or "1"s are observed in the recovered data.

Figure 4:
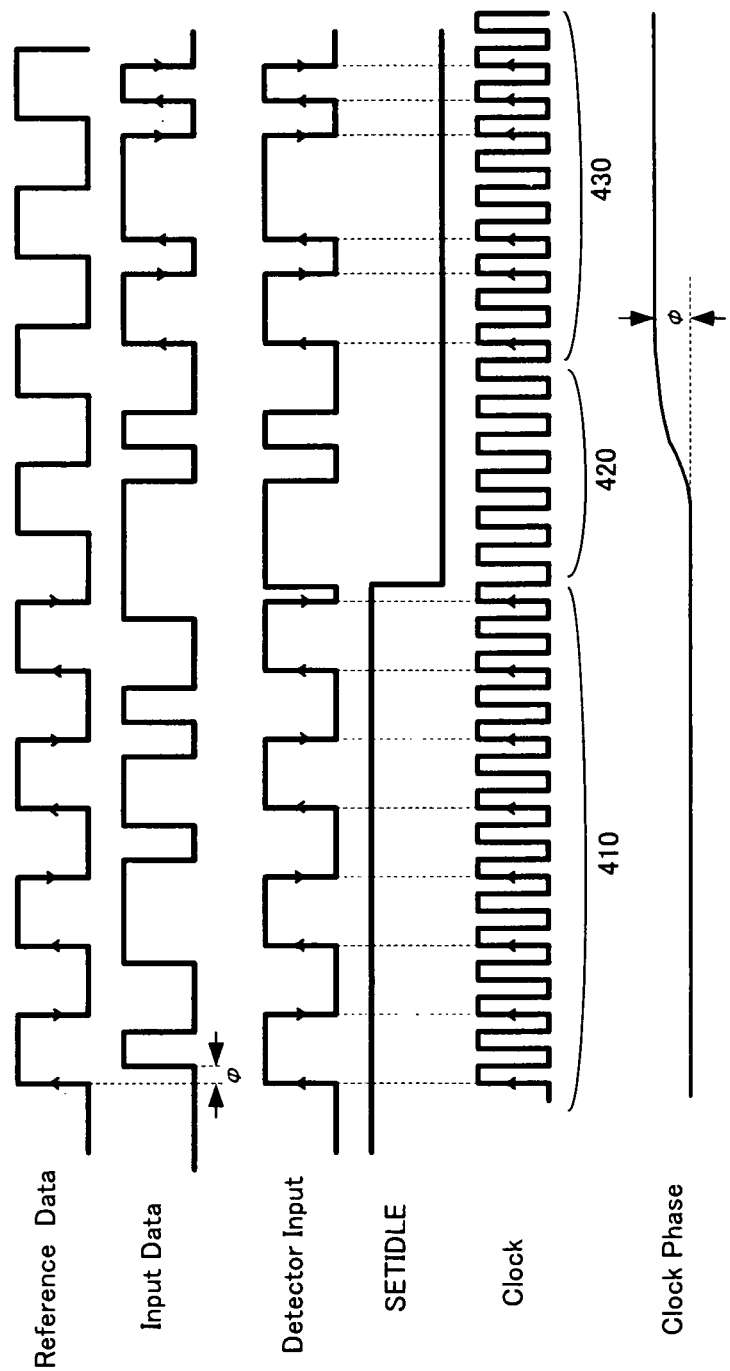
FIG. 4 shows an exemplary timing diagram according to an embodiment of this disclosure.

FIG. 4 shows an exemplary timing diagram of the BM-CDR 230 according to an embodiment of this disclosure. The BM-CDR 230 can phase-lock the clock signal to one of the reference data signal and the input data signal based on the SETIDLE signal.

When the SETIDLE signal is "1", the BM-CDR 230 can select the reference data signal as the detector input signal, and can be configured in an idle mode. In the idle mode, the BM-CDR 230 can phase-lock the clock signal to the reference data signal, in other words, synchronize edges of the clock signal with edges of the reference data signal, as shown by 410 in FIG. 4. More specifically, rising edges of the clock signal, which are marked with arrows, can synchronize with corresponding rising and falling edges of the reference data signal, which are also marked with arrows.

In the FIG. 4 example, the reference data signal can have a frequency that is ¼ of the transmitter clock frequency, for example, 10.3125 GHz. Further, the reference data signal can have a 50% duty ratio. The BM-CDR 230 can be designed to generate a clock signal having a frequency about the same as the transmitter clock frequency. When the BM-CDR 230 synchronizes every second rising edges of the clock signal with the rising and falling edges of the reference data signal, the BM-CDR 230 can generate the clock signal having substantially the same frequency of the transmitter clock frequency.

When the SETIDLE signal changes to "0", the BM-CDR 230 can select the input data signal as the detector input signal. The input data signal can correspond to a serial data signal received from an ONU. The ONU can generate the serial data signal based on an ONU clock signal that can be recovered from downstream transmissions, and can have a frequency substantially the same as the transmitter clock frequency of the OLT. In other words, both the input data signal and the reference data signal can be generated based on clock signals having substantially the same frequency.

When the input data signal is selected as the detector input signal, the BM-CDR 230 can take a locking time to phase-lock the clock signal to the input data signal, as shown by 420 in FIG. 4. After the locking time, the clock signal can be phase-locked to the input data signal. That is, when edges of the input data signal lead (or lag) corresponding edges of the reference data signal by a phase difference $\phi$, the BM-CDR advances (or delays) the phase of the clock signal by outputting up (or down) signals from the phase comparison block 234 until edges of the clock signal synchronize with corresponding edges of the input data signal.

As explained above, both the input data signal and the reference data signal are generated based on clock signals having substantially the same frequency. Accordingly, the clock signal phase-locked to the input data signal has substantially the same frequency as a frequency of the clock signal generated during the idle mode, which is phase-locked to the reference data signal, although the phases of these two clock signals differ by a phase difference $\phi$. As a result, the BM-CDR can reduce the locking time to phase-lock the clock signal to the input data signal, for example, in less than 10 ns.

It is noted that the BM-CDR 230 can use a same phase locked loop to selectively phase-lock the clock signal to one of the reference data signal and the input data signal when the SETIDLE signal changes from "1" to "0", and thus can keep stable operations. As a result, the locking time can be further shortened.

Figure 5:
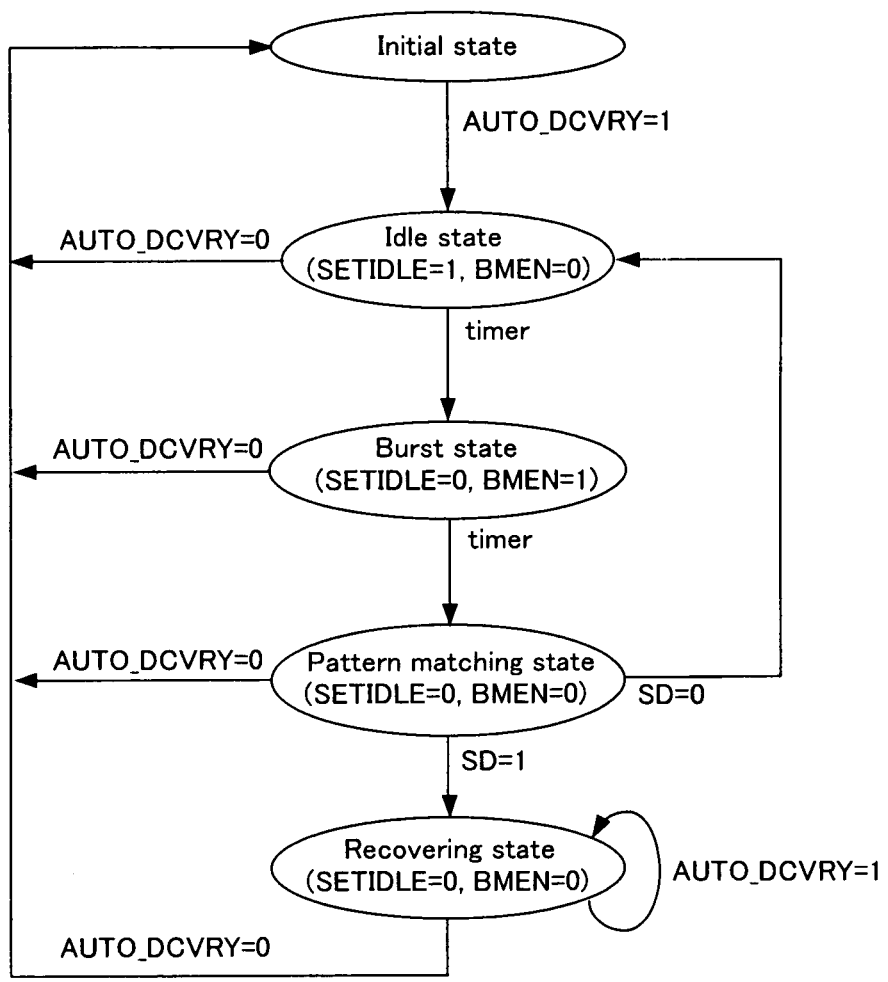
FIG. 5 shows a diagram of an exemplary discovery state machine according to an embodiment of this disclosure.

FIG. 5 shows a diagram of an exemplary state machine according to an embodiment of this disclosure. The state machine may include 5 states: an initial state, an idle state, a burst state, a pattern matching state, and a recovering state, and can configure a BM-CDR to receive burst data.

During operation, for example, the state machine may receive an AUTO_DCVERY signal from an upper-level controller such as a media access control (MAC) layer of the OLT apparatus. When the AUTO_DCVERY signal is "0", the state machine can go to the initial state.

When the state machine is in the initial state, and the AUTO_DCVERY signal changes to "1", the state machine can go to the idle state. When the state machine is in the idle state, the state machine can output the SETIDLE signal in "1" and the BMEN signal in "0" to the BM-CDR 230. Accordingly, the BM-CDR 230 can be configured in the idle mode.

When the state machine is in the idle state, the state machine may change the state based on a timer. For example, after a predetermined time, the state machine can go to the burst state. In the burst state, the state machine can output the BMEN signal in "1" and the SETIDLE signal in "0". Accordingly, the BM-CDR 230 can be configured into the burst mode. More specifically, the SETIDLE signal can select the input data signal as the detector input signal, and the BMEN signal can configure various operation parameters, such as a front-end charging rate, a loop gain of the phase locked loop, and the like, to enable the BM-CDR 230 to phase-lock to the input data signal with a reduced locking time.

When the state machine is in the burst state, the state machine can also change state based on a timer. For example, after a predetermined time, the state machine can go to the pattern matching state, and output the BMEN signal in "0" and output the SETIDLE signal in "0". Accordingly, the BM-CDR can be configured into the continuous mode. More specifically, the SETIDLE signal can stay at "0", and select the input data signal as the detector data signal, and the BMEN signal can configure various operation parameters, such as the loop gain, and the like, to enable the BM-CDR to phase-lock to the input data signal with an increased stability.

When the BM-CDR is in the burst mode and in the continuous mode, data can be recovered from the input data signal. The recovered data can be compared to a predetermined pattern by the pattern matching circuit. The pattern matching circuit can provide the matching result as the SD signal to the state machine. For example, when the SD signal is "1", the recovered data matches the predetermined pattern, and when the SD signal is "0", the recovered data does not match the predetermined pattern. After a predetermined time, the state machine can change state based on the SD signal. More specifically, when the SD signal is "1", the state machine can go to the recovering state; and when the SD signal is "0", the state machine can go back to the idle state.

When the state machine changes to the recovering state, the state machine can keep outputting the BMEN signal in "0" and the SETIDLE signal in "0". Accordingly, the BM-CDR can stay in the continuous mode to continuously recover data in the input data signal.

In the recovering state, the state machine can change state based on the AUTO_DCVERY signal. For example, when the AUTO_DCVERY signal stays "1", the state machine can stay in the recovering state. When AUTO_DCVERY signal changes to "0", which may correspond to the end of the discovery window, the state machine can return to the initial state. Also, in each of the idle, burst, and pattern matching states, the state machine can return to the initial state when AUTO_DCVERY signal changes to "0".

When the state machine is in the pattern matching state, it is also possible to keep the BM-CDR in the burst mode by keeping the BMEN signal in "1". In this case, the BMEN changes from "1" to "0" and configure the BM-CDR in the continuous mode when the state machine changes to the recovering state.

It is also possible to configure the pattern matching circuit to further compare the recovered parallel data to a predetermined pattern of the reference data signal and generate a reference data detection signal RD. In this case, when the state machine is in the idle mode, the state machine can change state based on the RD signal. Thereby, the process may proceed to the burst mode immediately after the BM-CDR synchronizes the edges of the clock signal to the edges of the reference data signal.

Figure 6:
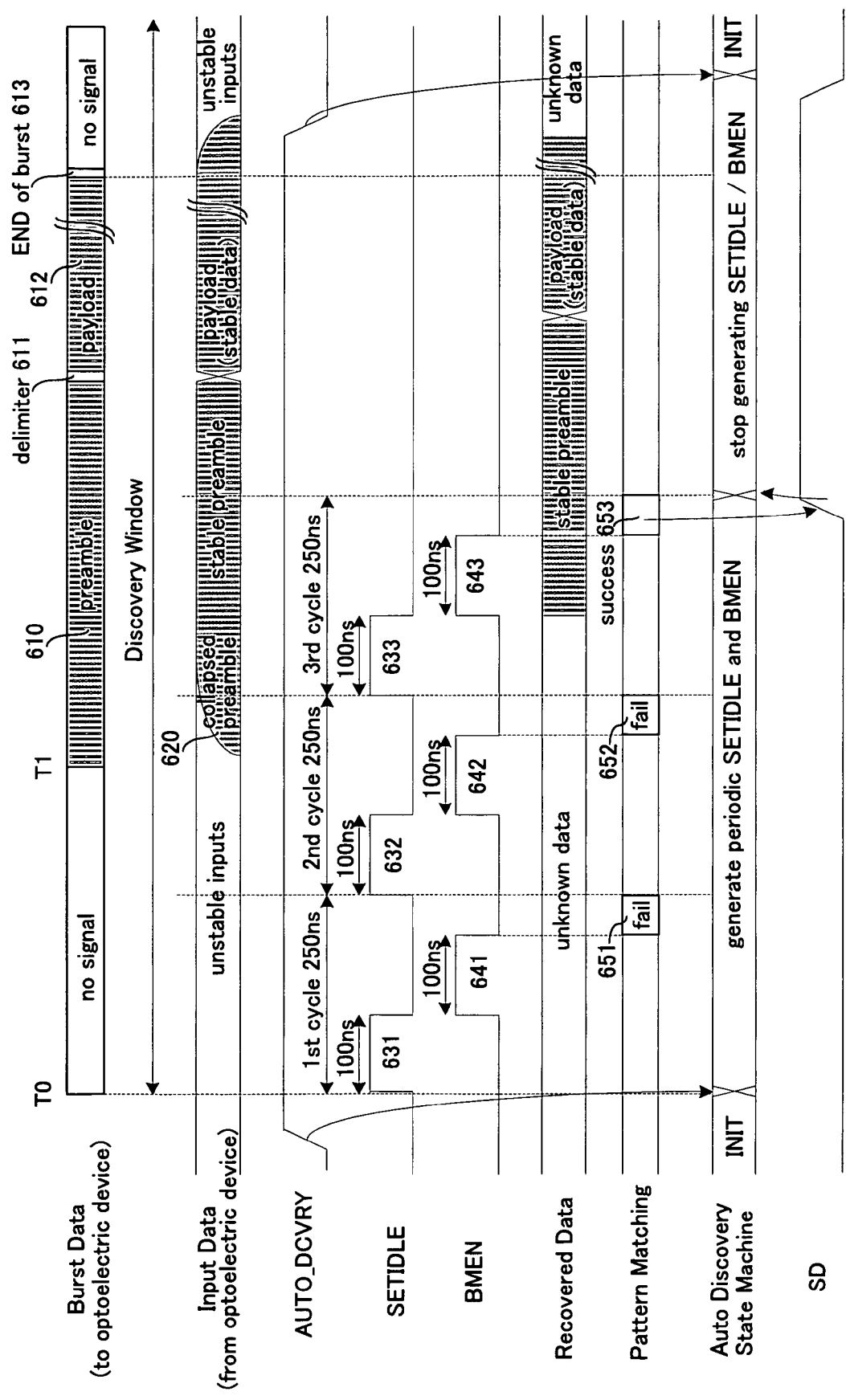
FIG. 6 shows a plot of an exemplary timing diagram based on the state machine in FIG. 5.

FIG. 6 shows a plot of an exemplary timing diagram for the OLT apparatus based on the state machine in FIG. 5.

At T0, the OLT apparatus can start a discovery window. At T1, the OLT apparatus can receive input data signal corresponding to a burst data packet that can be a registration request message from an unregistered ONU. The burst data packet can include a preamble portion 610, a delimiter portion 611, a payload portion 612, and an end of burst portion 613. The preamble portion 610 can repetitively include a predetermined bit pattern specified by the standard. The delimiter portion 611 can include a predetermined pattern for indicating a boundary of the payload portion 612. The end of burst portion 613 can also include a predetermined pattern for indicating the end of the burst data packet. The payload portion 612 can include data necessary to register the ONU with the OLT apparatus.

Optoelectric device of the OLT apparatus can receive the burst data packet as optical signals. The optoelectric device can convert the optical signals into electrical signals, and provide the electrical signals to the front-end of the receiver. The optoelectric device may take a time to settle according to the optical signals. That is, the optoelectric device does not produce stable electrical signal during a settling time after it starts receiving optical signals corresponding to the burst data packet. Thus, a portion of the input data signals corresponding to the beginning of the burst data packet can be collapsed, as shown by 620.

Before T0, the AUTO_DCVRY signal, which may be supplied from the MAC layer of the OLT apparatus to the controller 250, can be "0", and the state machine can stay in the initial state. At T0, the OLT apparatus can start the discovery window by changing the AUTO_DCVRY signal to "1". Thus, the state machine can go to the idle state and output the SETIDLE signal as "1". Accordingly, the BM-CDR can be configured in the idle mode.

In an embodiment, the BM-CDR can stay in the idle mode for 100 ns, which can be sufficient for the BM-CDR to synchronize edges of the clock signal with edges of the reference data signal, as shown by 631. Then, the state machine can go to the burst state, and output the SETIDLE signal as "0" and the BMEN signal as "1". Accordingly, the BM-CDR can be configured in the burst mode.

Similarly, the BM-CDR can stay in the burst mode for 100 ns, as shown by 641, which can be sufficient for the BM-CDR to synchronize edges of the clock signal with edges of the input data signal corresponding to the preamble portion that has been received by the front-end module in stable. However, when the input data signal does not correspond to stably received preamble portion, the BM-CDR cannot synchronize edges of the clock signal with edges of the input data signal and cannot recover the clock signal from the input data signal. Then, the state machine can go to the pattern matching state, and output the SETIDLE signal as "0" and the BMEN signal as "0". Accordingly, the BM-CDR can be configured in the continuous mode.

In the embodiment, the BM-CDR can stay in the continuous mode for 50 ns, and tries to recover data to provide to the pattern matching circuit. The pattern matching circuit can try to find the predetermined bit pattern in the recovered data, for example, from the deserializer. When the pattern matching circuit fails to find the predetermined bit pattern, the pattern matching circuit can output the SD signal as "0", as shown by 651. Accordingly, when the 50 ns expires, the state machine can go to the idle state, and the BM-CDR can be configured into the idle mode again to initiate a second cycle of the automatic discovery process.

In the second cycle, as shown by 632, 642 and 652, the burst data can be received by the BM-CDR, but the data has not yet stabilized. Accordingly, when the pattern matching circuit fails to find the predetermined bit pattern, the pattern matching circuit can output the SD signal as "0". When the second cycle fails, the BM-CDR can initiate a third cycle of the automatic discovery process.

In the third cycle, when the BM-CDR is configured in the burst mode, as shown by 643, data in the preamble portion can be stably received by the BM-CDR as the input data signal, for example, after a settling time of the optoelectric device. The BM-CDR can recover the clock signal from the input data signal. Then, in the continuous mode, as shown by 653, the BM-CDR can recover the data in the preamble portion, and the pattern matching circuit can find the predetermined bit pattern in the recovered data. Accordingly, the pattern matching circuit can output the SD signal as "1".

When the state machine receives the SD signal in "1", the state machine may stop generating the SETIDLE and BMEN signals, and the BM-CDR can stay in the continuous mode. During the continuous mode, the BM-CDR can further recover the data in the payload portion.

As explained above, the BM-CDR stays in the idle mode for a time period sufficient to synchronize edges of the clock signal with edges of the reference data signal. However, it is not desirable to make the time period of the idle mode excessively long, because the BM-CDR cannot receive the burst data within the idle mode.

Similarly, the BM-CDR stays in the burst mode for a time period sufficient to synchronize edges of the clock signal with edges of the input data signal, and the BM-CDR further stays in the continuous mode for a time period sufficient for the pattern matching circuit to perform the pattern matching. However, it is not desirable to make the time periods of the burst and continuous modes excessively long. If the burst mode or the continuous mode continues while no stable signal corresponding to the burst data is received, the BM-CDR may become unstable and cannot maintain generation of the clock signal with a stable frequency. When the BM-CDR starts to receive stable data signal after it becomes unstable, the BM-CDR cannot phase-lock the clock signal to the input data signal within a short locking time.

Accordingly, it is desirable to set the time periods of the idle, burst, and continuous modes in each cycle not excessively long and repeat the cycles with a short cycle time. Thereby, it becomes possible to phase-lock to and to recover the burst data with a minimum delay time after the BM-CDR starts to receive the stable burst data signal. As a result, it is possible to shorten the length of the preamble portion of the burst data. The cycle period may be further shortened by utilizing a result of detection of the reference data in the recovered data to change the BM-CDR from the idle mode to the burst mode.

The process described above does not use an external detection signal. That is, the pattern matching circuit 240, which is included within the transceiver 200, generates the SD signal when the data recovered by the BM-CDR 230 matches the predetermined pattern. The controller 250 keeps the BM-CDR in the continuous mode when the SD signal is supplied from the pattern matching circuit so that the payload portion of the burst data can be received. The SD signal can be generated reliably, because the pattern matching can reliably detect burst data having a predetermined pattern from noises.

When the BM-CDR receives the end of burst portion 613, the AUTO_DCVRY signal may return to "0" and the state machine may return to the initial state. For example, the pattern matching circuit 240 may be configured to detect a bit pattern of the end of burst portion 613, and to supply an end detection signal indicating that the end of burst portion is detected to the state machine. Thereafter, the AUTO_DCVRY signal may change to "1" again to discover a registration request message from another unregistered ONU. Thereby, the receiver may discover registration request messages from the next and the following unregistered ONUs with no initiation by the MAC layer of the OLT apparatus 110.

Now, again refereeing to FIG. 4, an optional feature of the BM-CDR 230 will be explained. As previously explained, when edges of the input data signal lead (or lag) corresponding edges of the reference data signal by a phase difference $\phi$, the BM-CDR advances (or delays) the phase of the clock signal by outputting up (or down) signals from the phase comparison block 234 until edges of the clock signal synchronize with corresponding edges of the input data signal.

However, when the phase difference $\phi$ is about 180°, or a half of the minimum interval between edges of the input data signal, the phase comparison block 234 of the BM-CDR 230 may output equal numbers of up signals and down signals, and the edges of the clock signal may be stuck at the same positions. As a result, the BM-CDR 230 cannot phase-lock the clock signal with the input data signal within a short locking time. This problem is shown in, for example, FIG. 2C of U.S. Pat. No. 6,404,248, which is incorporated by reference in its entirety, and FIG. 9 of Japanese Patent Publication No. Hei 11-239120.

Accordingly, the BM-CDR 230 can optionally include a circuit (a clock phase moving circuit) that forces to temporality move the phase of the clock signal in one of the directions when the BM-CDR changes from the idle mode to the burst mode. For example, the clock phase moving circuit can be controlled by the BMEN signal and temporarily moves the phase of the clock signal to a predetermined direction when the BMEN signal changes from "0" to "1".

Specifically, for example, the loop control circuit 236 can include the clock phase moving circuit that can generate a predetermined number of up or down signals within a predetermined duration after the BMEN signal changes from "0" to "1". The loop control circuit 236 can receive up and/or down signals from the phase comparison block and also from the clock phase moving circuit and can generate the oscillator control signal by counting the numbers of all up and down signals.

Alternatively, the oscillator 238 can include the clock phase moving circuit that changes the oscillation frequency of the oscillator 238 within a predetermined duration after the BMEN signal changes from "0" to "1". Further alternatively, for example, when the BM-CDR 230 includes an adjustable delay block through which the output of the oscillator 238 is supplied to the phase comparison block 234, the adjustable delay bock can include the clock phase moving circuit that forces to change the delay time when the BMEN signal changes from "0" to "1".

Accordingly, even if the phage difference $\phi$ is about 180°, the BM-CDR 230 can temporarily moves the phase of the clock signal when it changes from the idle mode to the burst mode. Note that the BM-CDR keeps controlling the oscillator using the phase comparison output signal while the clock phase moving circuit operates. Accordingly, once the clock phase moving circuit moves the phase of the clock signal, the BM-CDR 230 can phase-lock the clock signal to the input data signal within a short locking time.

For example, when the oscillation frequency of the oscillator 238 is controlled by an operation current of the oscillator, a switch to add (or subtract) a predetermined amount of current to (or from) the operation current may be provided as the clock phase moving circuit. When the BMEN signal changes from "0" to "1" and the BM-CDR changes from the idle mode to the burst mode, the switch may be turned-ON. As a result, the oscillation frequency increases (or decreases) and the phase of the clock signal starts to move relative to the phase of the input data signal. Then, the BM-CDR can start moving the edges of the clock signal even if the phage difference $\phi$ is about 180°.

The switch may be turned-OFF when a predetermined duration elapse. Alternatively, the switch may be kept ON throughout the period that the selector 232 of the BM-CDR selects the input data signal as the detector input signal. In either case, the BM-CDR continues to move the phase of the clock signal until the edges of the clock signal are aligned with the edges of the input data signal. That is, by increasing (or decreasing) the oscillation frequency, the clock phase moving circuit can temporarily move the phase of the clock signal when the BM-CDR changes from the idle mode to the burst mode. In other words, the clock phase moving circuit can move the phase of the clock signal during a limited period that starts when the BM-CDR changes to the burst mode.

In the case that the switch is kept ON during the burst mode, the switch may be turned-OFF when the BM-CDR changes to the idle mode. Alternatively, the switch may be kept ON even after the change to the idle mode and turned-OFF when the BM-CDR again changes to the burst mode. In this case, the predetermined direction that the clock phase moving circuit moves the phase of the clock signal is altered depending on the switching direction of the switch.

The ability of the clock phase moving circuit to move the phase of the clock signal can be adjusted appropriately. The circuit can have a sufficient ability to move the phase of the clock signal so that the BM-CDR moves away from the situation that the phage difference $\phi$ is about 180°. On the other hand, the amount of move of the phase can be limited so that it does not disturb the operation of the BM-CDR when the phage difference $\phi$ is about 0°. In addition, the duration that the clock phase moving circuit moves the phase of the clock signal can be limited in order to avoid a negative impact on the locking time. Accordingly, the clock phase moving circuit can shorten the locking time in the worst case (i.e., the phase difference is about 180°) without significantly increasing the average locking time.

Figure 7:
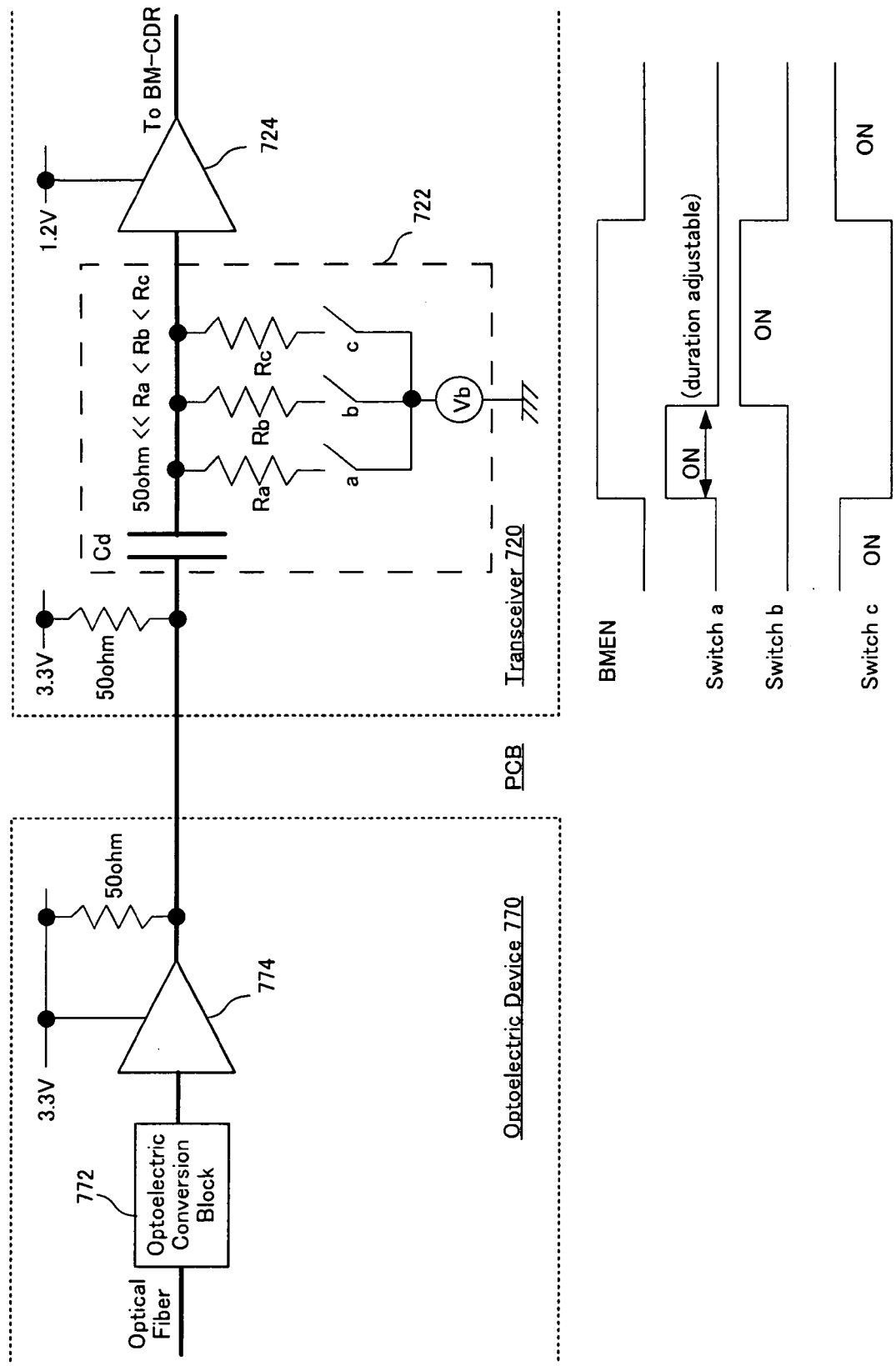
FIG. 7 shows a diagram of an exemplary front-end module according to an embodiment of this disclosure.

FIG. 7 shows a diagram of an exemplary front-end module according to an embodiment of this disclosure. The front-end module of the transceiver 720 can include a decoupling capacitor unit 722 and an input buffer unit 724 coupled together as shown in FIG. 7. The front-end module 720 may receive an electrical signal from an optoelectric device 770.

The optoelectric device 770 can include a optoelectric conversion block 772 and an output buffer block 774 coupled together as shown in FIG. 7.

The input buffer unit 724 may be a current mode logic (CML) buffer constructed with CMOS devices that can operate with a low power supply voltage, for example, 1.2V. However, the output buffer 774 may be a CML buffer constructed with bipolar devices that can operate with a higher power supply voltage of, for example, 3.3V. The decoupling capacitor unit 722 can decouple the supply voltage differences between the devices.

However, when the output buffer 774 starts to output electrical signals corresponding to burst data, an average voltage at the output terminal of the output buffer 774 can change. Thus, an average voltage at the input terminal of the input buffer unit 724 can also change, and the input buffer unit 724 cannot operate properly until the decoupling capacitor in the decoupling capacitor unit 722 is sufficiently charged to compensate for the average voltage variation.

According to an embodiment of this disclosure, the decoupling capacitor unit 722 can include a decoupling capacitor Cd and switchable resistors, for example, Ra, Rb and Rc, that can be switched based on the BMEN signal to change the resistance coupled to the bias voltage supply Vb. Specifically, when the state machine changes from the idle state to the burst state, the state machine may output the BMEN signal as "1". When the BMEN signal changes to "1", the resistor Ra can be coupled to the bias voltage supply Vb for an adjustable duration, thus the decoupling capacitor Cd can be charged via the resistor Ra.

The resistor Ra can be configured to have a reduced resistance, for example, Ra<Rb<Rc, thus, the decoupling capacitor Cd can be charged with an increased current. Thus, the front-end can be settled in a reduced time. Further, the resistors Rb and Rc can be suitably switched to couple the bias voltage supply Vb with the decoupling capacitor Cd. For example, the resister Rb can be coupled to the bias voltage supply while the BMEN signal is "1" after the adjustable duration, and the resistor Rc can be coupled while the BMEN signal is "0". Values of the resisters Rb and Rc are determined according to operation requirements of the front-end module for receiving the preamble and payload portions, respectively, of the burst data.

Although the burst data recovery process of this disclosure may be suitably used to receive registration request messages from unregistered ONUs, the process may also be used to receive other upstream communications. For example, the process may be used to receive upstream communications from already registered ONUs.

As explained above, a registered ONU transmits upstream communication within a time slot given by the OLT. Accordingly, the OLT knows when upstream communications from the ONUs will be received. However, because operation timings of a network system may vary, the OLT need to frequently update the timing information in order to know the exact timing when the upstream communications will be received. Instead of frequently updating the timing information, the OLT may use the burst data recovery process of this disclosure, which enables to recover the burst data without knowing when the communications will be received, to receive upstream communications from registered ONUs.

Figure 8:
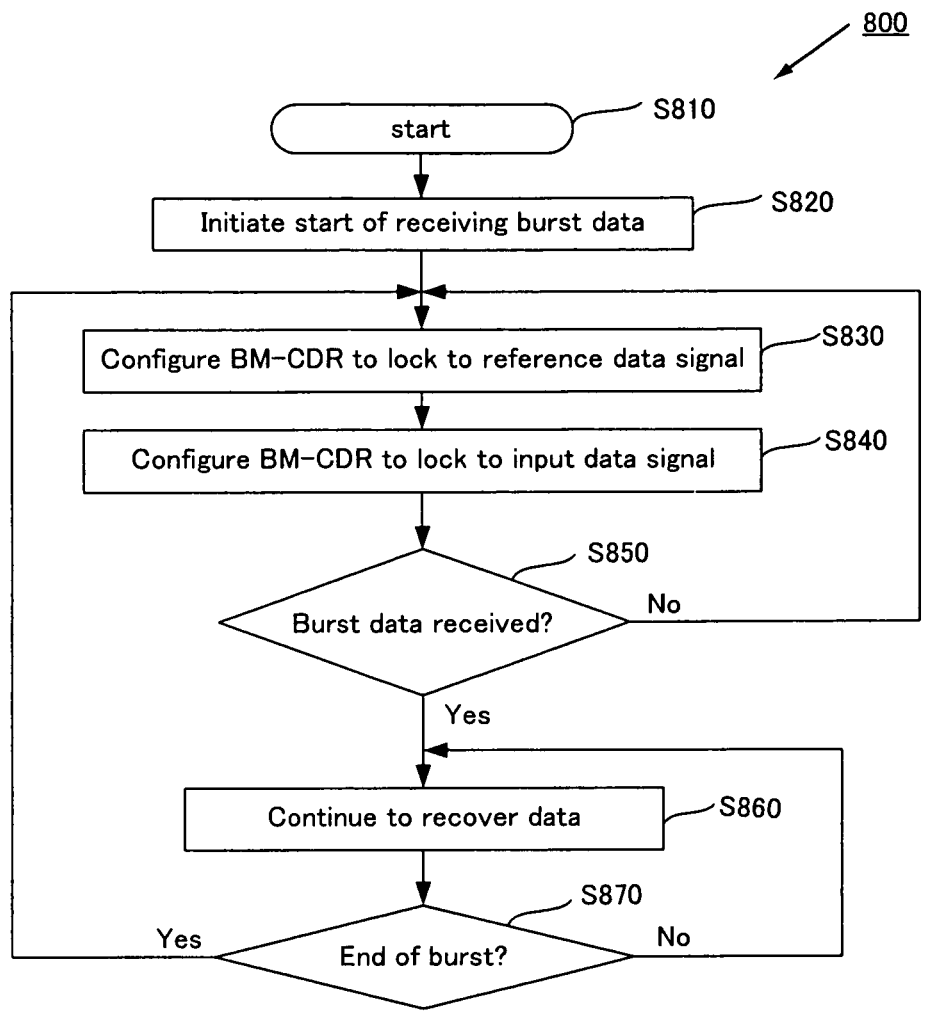
FIG. 8 shows a flow chart outlining an exemplary burst data recovery process according to an embodiment of this disclosure.

FIG. 8 shows a flow chart outlining an exemplary burst data recovery process according to another embodiment of this disclosure. Specifically, the flow chart shown in FIG. 8 outlines an exemplary process 800 for recovering burst data received from registered ONUs. The process starts at step S810 and proceeds to step S820.

In step S820, the MAC layer of the OLT apparatus 110 can initiate the process, for example, after the end of the discovery window. Alternatively, the OLT apparatus 110 can initiate the process before the start of the time slot for the first one of the ONUs. Even if the timing information within the OLT is not updated, the OLT still knows approximate timings of the time slots, and can initiate the process by considering possible range of variation of the operation timing. The process then proceeds to step S830.

Steps S830, S840, S850, S860, and S870 are essentially the same as steps S330, S340, S350, S360, and S370, respectively, in the process shown in FIG. 3. When the recovered data does not match the predetermined preamble pattern in step S850, however, the process proceeds to step S830 and initiates another cycle of the process including steps S830, S840, and S850. Thus, the process can detect and recover burst data from the registered ONU even if the OLT apparatus 110 does not know the exact timing when the burst data will be received.

Further, when the recovered data matches the predetermined end pattern in step S870, the process proceeds to step S830 and initiates another cycle of the process including steps S830, S840, and S850. Thus, after detecting and recovering burst data from one of the registered ONUs, the process can further detect and recover burst data from the next one of the registered ONUs with no initiation by the MAC layer of the OLT apparatus 110.

Alternatively, the MAC layer of the OLT apparatus 110 can initiate the another cycle of the process after the time slot for one of the registered ONUs ends. Further, the MAC layer of the OLT apparatus 110 can terminate the process shown in FIG. 8 after the time slot for the last one of the registered ONUs ends.

In order to simplify the control by the MAC layer, however, it is desirable to configure the receiver 202 to be able to initiate the next cycle of the process without requiring an initiation by the MAC layer. For example, the controller 250 of the receiver 201 shown in FIG. 2 may be configured to generate the AUTO_DCVRY signal instead of receiving the signal from the MAC layer of the OLT apparatus 110. Thereby, the receiver 202 can initiate the next cycle of the process without requiring an initiation by the MAC layer.

Figure 9:
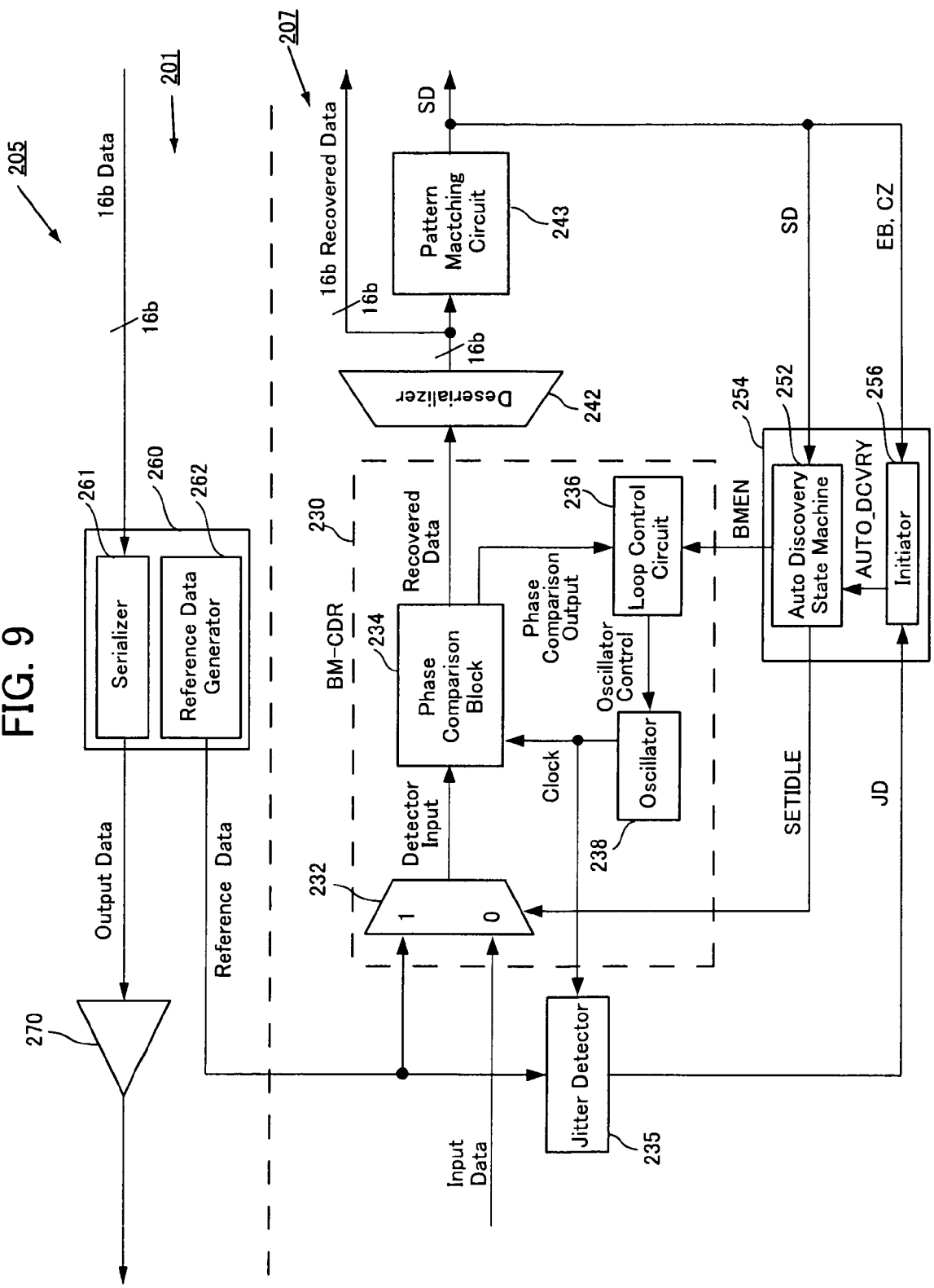
FIG. 9 shows a block diagram of an exemplary transceiver according to another embodiment of this disclosure.

FIG. 9 shows a block diagram of an exemplary burst data transceiver 205 according to another embodiment of this disclosure. The transceiver 205 includes the same transmitter 202 as the exemplary transceiver 200 shown in FIG. 2 and a burst data receiver 207. The burst data receiver 207 may include a pattern matching circuit 243 instead of the pattern matching circuit 240 included in the receiver 202 shown in FIG. 2. The pattern matching circuit 243 may generate, in addition to the detection signal SD, an end of burst signal EB when it detects the predetermined bit pattern for the end of burst portion of the burst data.

The burst data receiver 207 includes a controller 254 instead of the controller 250 included in the receiver 202 shown in FIG. 2. The controller 254 may include, in addition to the auto discovery state machine 252, an initiator 256 that generates the AUTO_DCVRY signal. When the initiator 256 receives the signal EB from the pattern matching circuit 243, the initiator 256 may change the AUTO_DCVRY signal to "0" so that the auto discovery state machine 252 shown in FIG. 5 returns to the initial state. The initiator 256 may further change the AUTO_DCVRY signal to "1" when a predetermined time period elapses so that the state machine 252 goes to the idle state. Thereby, the receiver 207 can initiate the next cycle of the process without requiring an initiation by the MAC layer.

In FIGS. 3 and 8, process 300 for detecting and recovering burst data from unregistered ONUs and process 800 for detecting and recovering burst data from registered ONUs are described as separate processes. However, these processes 300 and 800 include essentially the same steps of S330, S340, S350, S360, and S370 shown in FIG. 3, and steps S830, S840, S850, S860, and S870 shown in FIG. 8. In fact, the receiver may detect and recover burst data without distinguishing whether the burst data is received from an unregistered ONU or from a registered ONU.

The initiator 256 may change the AUTO_DCVRY signal to "0" and then to "1" when, for example, the receiver 207 is powered-up so that the auto discovery state machine 252 initiates the first cycle of the detecting and recovering process. The initiator 256 may further change the AUTO_D-CVRY signal to "0" and then to "1" when, for example, the pattern matching circuit 243 detects the end of the burst data so that the state machine 252 initiates the second and following cycles of the process. Thereby, the receiver 207 may detect and recover burst data from registered and unregistered ONUs without any control by the MAC layer of the OLT apparatus 110.

The transceiver 205 recovers burst data without distinguishing whether the data is from an unregistered ONU or from a registered ONU and outputs the recovered data to the MAC layer of the OLT apparatus. Then, the MAC layer determines whether the data is, for example, a registration request message from an unregistered ONU or an upstream communications from a registered ONU, and processes the recovered data appropriately.

In the receiver 207 shown in FIG. 9, the pattern matching circuit 243 acts as means for detecting the end of the burst data. That is, the pattern matching circuit 243 detects the end of burst portion of the burst data and supplies the signal EB to the controller 254. Thereby, the controller 254 initiates the next cycle of the detecting and recovering process after the end of the burst data.

However, the pattern matching circuit 243 cannot detect the end of burst portion of the burst data if the receiver 207 does not stably receive the end of burst portion due to, for example, instability of the network 100. Thus, if the network becomes instable after the state machine changes to the recovering state, the state machine stays in the recovering state and the controller 254 cannot initiate the next cycle of the process. In order to overcome this problem, the receiver 207 may further include one or more additional means for detecting the end of the burst data.

For example, the pattern matching circuit 243 may be configured to detect, in addition to the predetermined bit pattern for the end of burst portion, continuous "0"s in the recovered data. That is, the pattern matching circuit 243 may be configured to detect a predetermined number of consecutive "0"s in the recovered data and generates a consecutive zeros signal CZ, as shown in FIG. 9. The pattern matching circuit 243 may be further configured to detect a predetermined number of consecutive "1"s in the recovered data and generates a consecutive ones signal CO. The controller 254 may initiate the next cycle of the process when the controller receives the signal CZ or the signal CO, even if the pattern matching circuit 243 can not detect the end of burst portion.

The receiver 207 may further includes a jitter detector 235 that measures an amount of jitter in the clock signal recovered by the BM-CDR 230 and generates a jitter detect signal JD when the amount exceeds a predetermined value. When the receiver 207 receives stable burst data signal, the BM-CDR 230 can generate a clock signal stably locked to the received signal. Accordingly, the amount of jitter in the clock signal is small.

When the burst data ends while the state machine is in the recovering state, on the other hand, the BM-CDR becomes unstable and cannot maintain generation of the clock signal with a small amount of jitter. Accordingly, the jitter detector 235 may detect the end of the burst data when the amount of jitter exceeds a predetermined threshold value and generate a jitter detect signal JD. The controller 254 may initiate the next cycle of the process by using the jitter detect signal JD, even if the pattern matching circuit 243 can not detect the end of burst portion.

The jitter detector 235 shown in FIG. 9 receives the recovered clock signal from the BM-CDR 230 and the reference data signal from the reference data generator 262. The jitter detector 235 may detect jitter in the recover clock signal by, for example, i) comparing the phases of the recovered clock signal and the reference data signal, and ii) observing if the result of comparison changes.

Specifically, for example, the jitter detector 235 may samples levels of the recovered clock signal at the edges of the reference data signal by using, for example, a D-type flip-flop. When, for example, the reference data signal has, or divided to have, the same frequency as the frequency of the recovered clock signal, the level of the recovered clock signal is sampled once within each of the cycles of the recovered clock signal. Alternatively, the level of the recovered clock signal may be sampled once within a predetermined number of cycles. The sampled level may be temporally stored in, for example, another D-type flip-flop, and compared with the level sampled at the next edge of the reference data signal.

When the recovered clock signal is locked to the stable burst data signal, the level of the recovered clock signal sampled at the edges of the reference data signal does not changes. After the end of the burst data, on the other hand, the amount of jitter in the recovered clock signal increases and the level may change. Accordingly, the jitter detector 235 may generate the signal JD when the change of the level is detected. The jitter detector 235 may further include a counter and generate the signal JD when a predetermined number of changes of the level are detected within a certain time period.

As shown in FIG. 4, the phase of the recovered clock signal locked to the burst data signal may be different from the phase of the reference data signal. When, for example, edges of the reference data signal approximately coincide with edges of the recovered clock signal, it is impossible to reliably sample the levels of the recovered clock signal.

In order to overcome this problem, the jitter detector 235 may sample levels of the recovered clock signal at two or more different timings within the cycle of the reference data signal, and detect changes of levels sampled at the respective timings. The jitter detector 235 may generate the signal JD only when the changes, or the predetermined number of changes, are detected in the levels sampled at all of the timings. Thereby, the jitter detector 235 may reliably detect the end of the burst data.

As also shown in FIG. 4, the phase of the recovered clock signal may shift during the burst mode even if the stable burst data signal is received. Accordingly, the jitter detector 235 may be configured to be inhibited to generate the signal JD when, for example, the BMEN signal is in "1".

As explained above, the receiver 207 includes a plurality of means for detecting the end of the burst data. The described means for detecting detects the end of the burst data by analyzing either of the data recovered by the BM-CDR 230 or a clock signal recovered by the BM-CDR. Accordingly, the means for detecting detects the end of the burst data within the receiver 207. Thus, the controller 254 can initiate the next cycle of the process, by using a signal supplied from at least one of the means for detecting, without requiring an initiation by the MAC layer.

Note that the recovered data may be output to the MAC layer. However, the pattern matching circuit 243, which is described as a means for detecting the end of the burst data by analyzing the recovered data, analyzes the recovered data before the data is output to the MAC layer. Accordingly, the pattern matching circuit 243 can detect the end of the burst data within the receiver 207.

It is not necessary for the receiver 207 to include all of the means for detecting described above. However, the receiver 207 may preferably include two or more means for detecting the end of the burst data so that the receiver can reliably initiate the next cycle of the process.

Figure 10:
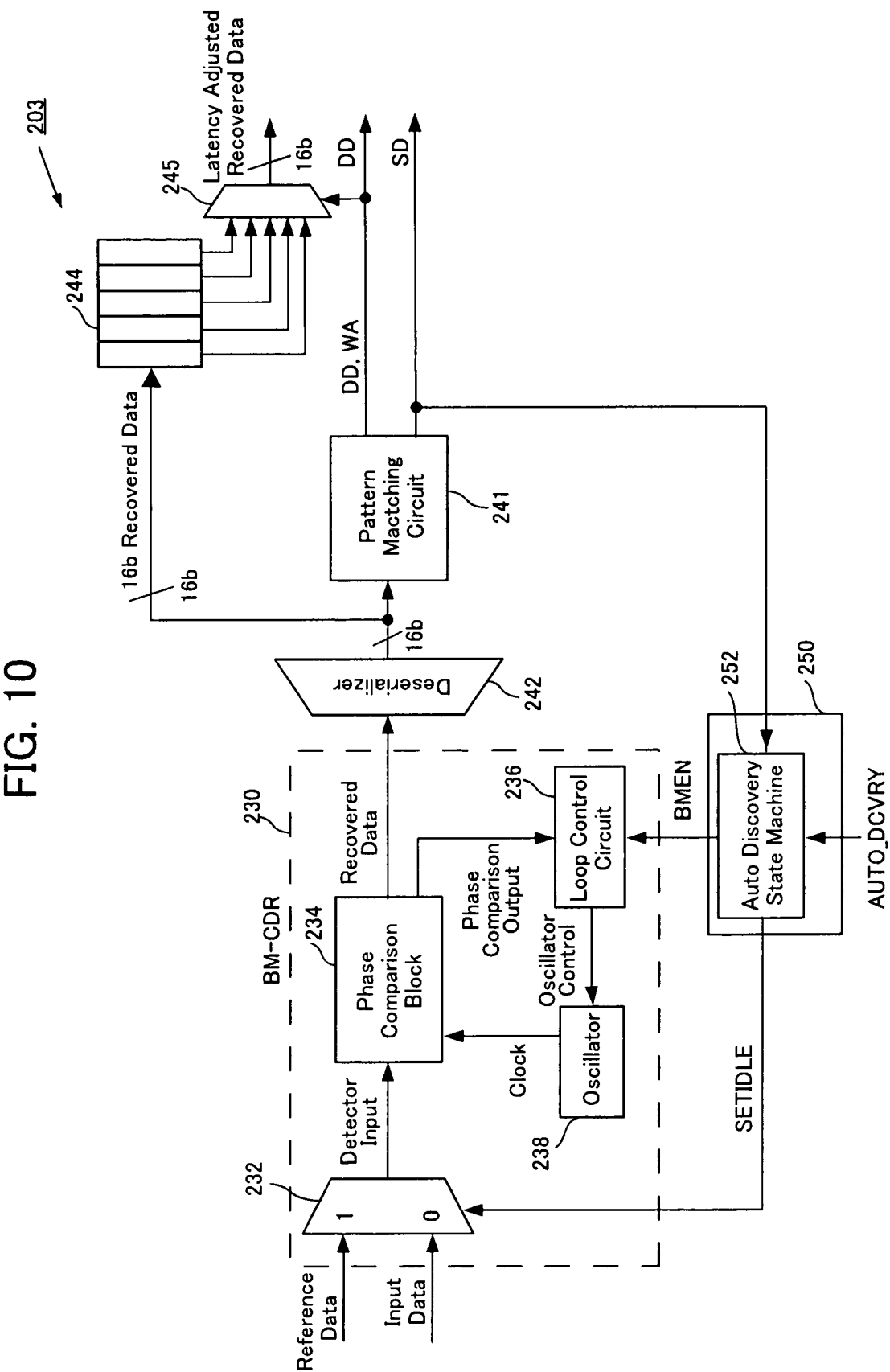
FIG. 10 shows a block diagram of an exemplary burst data receiver according to another embodiment of this disclosure.

FIG. 10 shows a block diagram of an exemplary burst data receiver 203 according to another embodiment of this disclosure. The receiver 203 includes, in addition to the components included in the receiver 202 shown in FIG. 2, an elastic buffer 244 and a selector 245. Further, the pattern matching circuit 240 is replaced with a pattern matching circuit 241.

Similar to the pattern matching circuit 240, the pattern matching circuit 241 can detect the preamble portion of the burst data and output a detection signal SD. The pattern matching circuit 241 can further detect the delimiter portion of the burst data and outputs detection signals DD and WA. The signal DD is output when the delimiter portion is detected. The signal WA indicates which bit of the parallel data corresponds to the starting bit of the delimiter.

The pattern matching circuit 241 may simultaneously compare the recovered parallel data to a plurality of patterns including the bit pattern of the delimiter portion starting at different bits within the parallel data. Thereby, the pattern matching circuit may reliably detect the delimiter portion and generate the signals DD and WA.

Based on these signals DD and WA, the selector 245 rearranges the data temporarily stored in the elastic buffer 244 and outputs latency adjusted recovered data. That is, the latency from the DD signal to the data in the latency adjusted recovered data corresponding to the starting bit of the delimiter is adjusted or fixed to a predetermined value.

The latency adjusted recovered data can be advantageously used, for example, to evaluate the receiver 203 by, for example, looping back serial output data signal generated by a serializer (e.g., 261 in FIG. 2) to the receiver 203. Because the latency from the DD signal is adjusted, it is possible to make a bit-by-bit comparison of the latency adjusted recovered data to the original parallel data input to the serializer 261. Thereby, the burst data receiver 203 can be easily evaluated.

Figure 11:
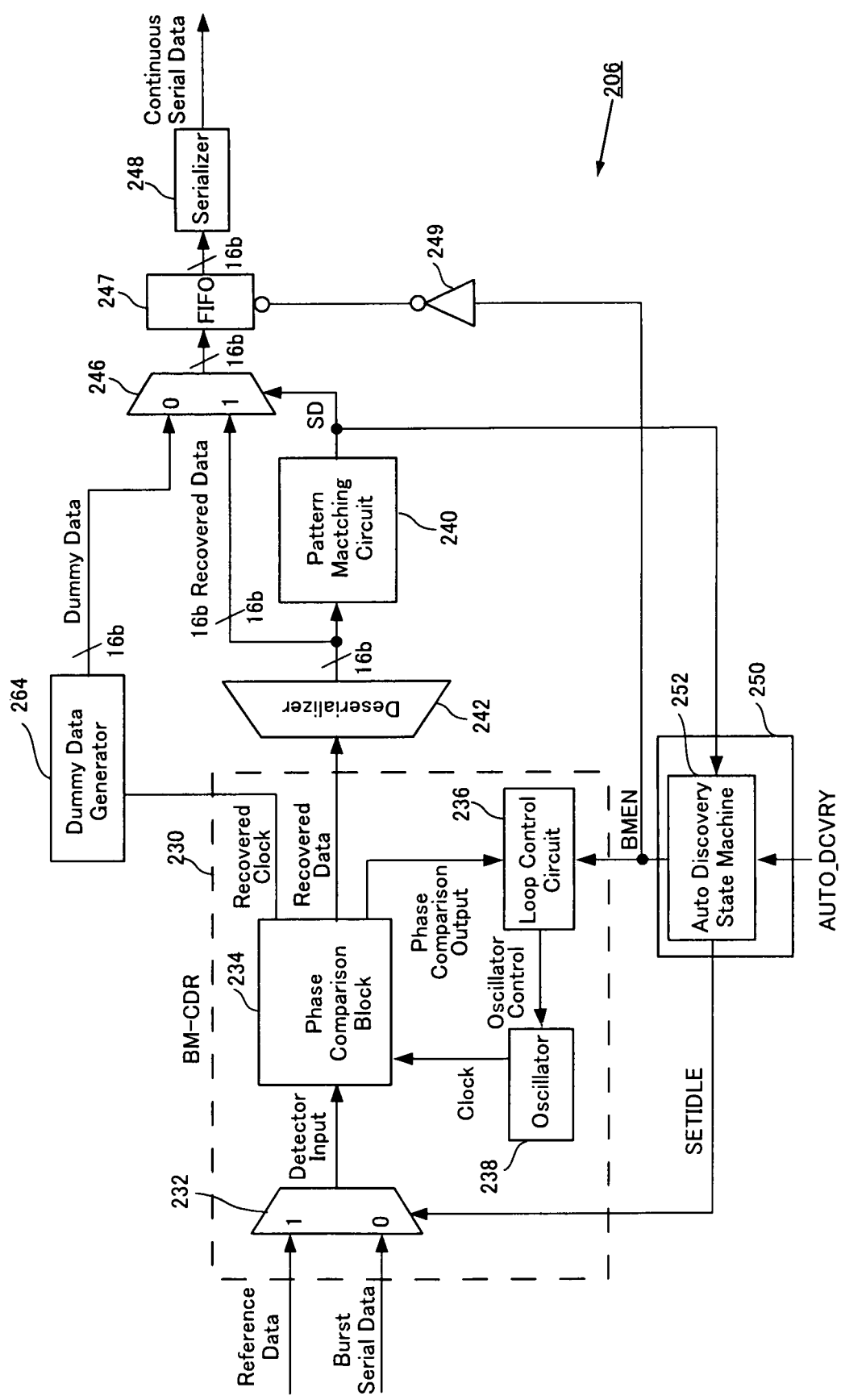
FIG. 11 shows a block diagram of an exemplary burst data receiver according to still another embodiment of this disclosure.

FIG. 11 shows a block diagram of an exemplary burst data receiver 206 according to another embodiment of this disclosure.

The burst data receiver 206 includes, in addition to the components included in the burst data receiver 202 shown in FIG. 2, a dummy data generator 264, a selector 246, a first-in first-out memory (FIFO) 247, and a serializer 248. The dummy data generator 264 generates dummy data based on a clock signal recovered by the BM-CDR 230. The dummy data is, for example, 16 bit parallel data. Each of the bits in the dummy data has a predetermined bit pattern. The serializer 248 generates serial data from the parallel data selected by the selector 246.

Alternatively, the dummy data generator 264 may generate the dummy data without using a clock signal. For example, some of the bits of the parallel dummy data may be fixed to "0" and the other bits may be fixed to "1". In this case, the serial data that the serializer 248 generates from the parallel dummy data has a predetermined bit pattern including "0"s and "1"s. That is, the bits of the parallel dummy data, as a whole, may have a predetermined bit pattern. The FIFO 247 makes a timing adjustment between the output from the selector 246 and the input to the serializer 248. The output of the serializer 248 is supplied to another circuit block (not shown) in the OLT apparatus as continuous serial data.

As shown in FIG. 6, the BM-CDR 230 can continuously output the recovered data after the detection signal SD changes to "1". However, the BM-CDR 230 can not continuously output the recovered data while the detection signal SD is "0". In fact, the BM-CDR 230 can output data recovered from the reference data signal when the BM-CDR 230 is in the idle mode. Nonetheless, the output of the recovered data discontinues while the BM-CDR 230 is in the burst and in the continuous modes before the input of the stable preamble.

Accordingly, if the recovered data from the deserializer 242 is serialized, the output serial data is discontinuous. In this case, another circuit block in the OLT apparatus need to have a burst mode CDR to receive the serial data.

On the other hand, the exemplary burst data receiver 206 shown in FIG. 11 includes a selector 246. The selector selects the recovered data from the deserializer 242 when the detection signal SD is "1", i.e., after the pattern matching circuit 240 detects the preamble portion in the recovered data, and selects the dummy data when the detection signal SD is "0", i.e., before the pattern matching circuit 240 detects the preamble portion. Thus, the selector 246 outputs continuous data, and the serializer 248 outputs continuous serial data. In this case, another circuit block can receive the serial data using a conventional (non-burst mode) CDR, which is less expensive that a burst mode CDR.

The BMEN signal is supplied to a reset terminal of the FIFO 247 through an inverter 249. Thus, the FIFO 247 is reset when the BMEN signal is "1". That is, the controller 250 resets write and read pointers of the FIFO 247 by supplying the BMEN signal, which is "1" during the BM-CDR 230 is in the burst mode. Thereafter, the pattern matching circuit 240 finds the preamble portion in the recovered data and changes the detection signal SD to "1" so that the serial data corresponding to the preamble portion and the payload portion of the burst data is output. Thus, over-flow or under-flow of the FIFO 247, which may occur when the FIFO is continuously used without being reset, is prevented.

In the exemplary receiver 206 shown in FIG. 11, the BMEN signal, which keeps "1" during the burst mode, is used to reset the FIFO 247. Accordingly, the FIFO 247 is kept in the reset state during the entire period that the BM-CDR 230 is in the burst mode. However, it is sufficient to reset the FIFO 247 only when the BM-CDR 230 changes from the idle mode to the burst mode, i.e., only during an initial portion of the period that the BM-CDR is in the burst mode.

For example, the BMEN signal may be supplied to the reset terminal of the FIFO 247 after the width of the BMEN signal is reduced by using a one-shot multi-vibrator. Thereby, the FIFO 247 is reset only during an initial portion, determined by the reduced width, of the period that the BM-CDR is in the burst mode.

In the exemplary receiver 206 shown in FIG. 11, the FIFO 247 is employed in combination with the dummy data generator 264. However, a FIFO, which is reset during at least a portion of the period that the BM-CDR is in the burst mode, may also be employed in a burst data receiver that does not employ the dummy data generator, such as the receiver 202 shown in FIG. 2.

While the invention has been described in conjunction with the specific exemplary embodiments thereof, it is evident that many alternatives, modifications, and variations will be apparent to those skilled in the art. Accordingly, exemplary embodiments of the invention as set forth herein are intended to be illustrative, not limiting. There are changes that may be made without departing from the spirit and scope of the invention.

What is claimed is:

1. An apparatus to receive a burst data signal having data edges and corresponding to burst data including an initial portion, the apparatus comprising:
   an input circuit configured to receive an electrical signal and output an input signal;
   a reference data signal generator configured to generate a reference data signal having reference edges;
   a clock data recovery (CDR) circuit configured to generate a clock signal having clock edges, the CDR circuit having a first mode that attempts to synchronize the clock edges with the reference edges, and a second mode that attempts to synchronize the clock edges with the data edges and to recover data from the input signal based on the clock signal;
   a detection circuit configured to detect the initial portion in the data recovered from the input signal; and
   a controller configured to conduct a process including following steps in sequence:
   setting the CDR circuit in the first mode to synchronize the clock edges with the reference edges;
   setting the CDR circuit in the second mode while supplying the data recovered from the input signal to the detection circuit;
   keeping the CDR circuit in the second mode when the detection circuit detects the initial portion in the data; and
   initiating a next cycle of the process when the detection circuit does not detect the initial portion in the data within a predetermined time period,
   wherein the CDR circuit includes a clock phase moving circuit that temporarily moves a phase of the clock signal to a predetermined direction when the process proceeds from the step of setting the CDR circuit in the first mode to the step of setting the CDR circuit in the second mode.

2. An apparatus to receive a burst data signal having data edges and corresponding to burst data including an initial portion, the apparatus comprising:
   an input circuit configured to receive an electrical signal and output an input signal;
   a reference data signal generator configured to generate a reference data signal having reference edges;
   a clock data recovery (CDR) circuit configured to generate a clock signal having clock edges, the CDR circuit having a first mode that attempts to synchronize the clock edges with the reference edges, and a second mode that attempts to synchronize the clock edges with the data edges and to recover data from the input signal based on the clock signal; a detection circuit configured to detect the initial portion in the data recovered from the input signal; and
   a controller configured to conduct a process including following steps in sequence:
   setting the CDR circuit in the first mode to synchronize the clock edges with the reference edges;
   setting the CDR circuit in the second mode while supplying the data recovered from the input signal to the detection circuit;
   keeping the CDR circuit in the second mode when the detection circuit detects the initial portion in the data; and
   initiating a next cycle of the process when the detection circuit does not detect the initial portion in the data within a predetermined time period,
   wherein the input circuit further comprises:
   a buffer for driving the input signal;
   an input capacitor having a first terminal to receive the electrical signal and a second terminal coupled to the buffer; and
   a pre-charge circuit configured to supply a fixed potential to the second terminal of the input capacitor via an adjustable resistance, wherein the resistance is reduced to a predetermined value when the process proceeds from the step of setting the CDR circuit in the first mode to the step of setting the CDR circuit in the second mode.

3. An apparatus to receive a burst data signal having data edges and corresponding to burst data including an initial portion, the apparatus comprising:
   an input circuit configured to receive an electrical signal and output an input signal;
   a reference data signal generator configured to generate a reference data signal having reference edges;
   a clock data recovery (CDR) circuit configured to generate a clock signal having clock edges, the CDR circuit having a first mode that attempts to synchronize the clock edges with the reference edges, and a second mode that attempts to synchronize the clock edges with the data edges and to recover data from the input signal based on the clock signal; a detection circuit configured to detect the initial portion in the data recovered from the input signal;
   a controller configured to conduct a process including following steps in sequence:
   setting the CDR circuit in the first mode to synchronize the clock edges with the reference edges;
   setting the CDR circuit in the second mode while supplying the data recovered from the input signal to the detection circuit;
   keeping the CDR circuit in the second mode when the detection circuit detects the initial portion in the data; and
   initiating a next cycle of the process when the detection circuit does not detect the initial portion in the data within a predetermined time period;
   a dummy data generator that generates a dummy data having a predetermined bit pattern; and
   a selector that selects and outputs the dummy data before the detection circuit detects the initial portion and the data recovered from the input signal after the detection circuit detects the initial portion.

4. An apparatus to receive a burst data signal having data edges and corresponding to burst data from an optical network unit (ONU) including an initial portion, the apparatus comprising:
   a transmitter configured to generate an output data signal to be transmitted to the ONU based on a transmitter clock signal;
   a reference data signal generator configured to generate a reference data signal having reference edges based on the transmitter clock signal;
   a clock data recovery (CDR) circuit configured to generate a clock signal having clock edges, the CDR circuit having a first mode that attempts to synchronize the clock edges with the reference edges, and a second mode that attempts to synchronize the clock edges with the data edges and to recover data from an input signal based on the clock signal;

a detection circuit configured to detect the initial portion in the data recovered from the input signal;

a controller configured to conduct a process including following steps in sequence:

setting the CDR circuit in the first mode to synchronize the clock edges with the reference edges;

setting the CDR circuit in the second mode while supplying the data recovered from the input signal to the detection circuit;

keeping the CDR circuit in the second mode when the detection circuit detects the initial portion in the data; and initiating a next cycle of the process when the detection circuit does not detect the initial portion in the data within a predetermined time period;

a dummy data generator that generates a dummy data having a predetermined bit pattern; and a selector that selects and outputs the dummy data before the detection circuit detects the initial portion and the data recovered from the input signal after the detection circuit detects the initial portion.

5. A method for receiving a burst data signal having data edges and corresponding to burst data including an initial portion, the method comprising:

receiving an input signal;

generating a reference data signal having reference edges;

generating a clock signal having clock edges by using a clock data recovery (CDR) circuit, the CDR circuit having a first mode that attempts to synchronize the clock edges with the reference edges, and a second mode that attempts to synchronize the clock edges with the data edges and to recover data from the input signal based on the clock signal; and conducting a process including following steps in sequence:

setting the CDR circuit in the first mode to synchronize the clock edges with the reference edges;

setting the CDR circuit in the second mode while trying to detect the initial portion in the data recovered from the input signal;

keeping the CDR circuit in the second mode when the initial portion is detected in the data; and initiating a next cycle of the process when the detection circuit does not detect the initial portion in the data within a predetermined time period, wherein the process includes temporarily moving a phase of the clock signal to a predetermined direction when the process proceeds from the step of setting the CDR circuit in the first mode to the step of setting the CDR circuit in the second mode.

6. A method for receiving a burst data signal having data edges and corresponding to burst data including an initial portion, the method comprising:

receiving an input signal;

generating a reference data signal having reference edges;

generating a clock signal having clock edges by using a clock data recovery (CDR) circuit, the CDR circuit having a first mode that attempts to synchronize the clock edges with the reference edges, and a second mode that attempts to synchronize the clock edges with the data edges and to recover data from the input signal based on the clock signal;

conducting a process including following steps in sequence:

setting the CDR circuit in the first mode to synchronize the clock edges with the reference edges;

setting the CDR circuit in the second mode while trying to detect the initial portion in the data recovered from the input signal;

keeping the CDR circuit in the second mode when the initial portion is detected in the data; and initiating a next cycle of the process when the detection circuit does not detect the initial portion in the data within a predetermined time period;

generating a dummy data having a predetermined bit pattern; and selecting and outputting the dummy data before the initial portion is detected and the data recovered from the input signal after the initial portion is detected.

7. A method for receiving a burst data signal having data edges and corresponding to burst data from an optical network unit (ONU) including an initial portion, the method comprising:

generating an output data signal to be transmitted to the ONU based on a transmitter clock signal;

generating a reference data signal having reference edges based on the transmitter clock signal;

generating a clock signal having clock edges by using a clock data recovery (CDR) circuit, the CDR circuit having a first mode that attempts to synchronize the clock edges with the reference edges, and a second mode that attempts to synchronize the clock edges with the data edges and to recover data from the input signal based on the clock signal;

conducting a process including following steps in sequence:

setting the CDR circuit in the first mode to synchronize the clock edges with the reference edges;

setting the CDR circuit in the second mode while trying to detect the initial portion in the data recovered from the input signal;

keeping the CDR circuit in the second mode when the initial portion is detected in the data; and initiating a next cycle of the process when the detection circuit does not detect the initial portion in the data within a predetermined time period;

generating a dummy data having a predetermined bit pattern; and selecting and outputting the dummy data before the initial portion is detected and the data recovered from the input signal after the initial portion is detected.

* * * * *